(12) United States Patent
Christensen et al.

(10) Patent No.: US 9,203,523 B2
(45) Date of Patent: Dec. 1, 2015

(54) MODULAR CHIP LAYOUT FOR ACTIVE OPTICAL LINKS

(75) Inventors: Steen Bak Christensen, Roskilde (DK); Thorkild Franck, Roskilde (DK)

(73) Assignee: MELLANOX TECHNOLOGIES DENMARK APS, Roskilde (DK)

( * ) Notice: Subject to any disclaimer, the term of this patent is extended or adjusted under 35 U.S.C. 154(b) by 398 days.

(21) Appl. No.: 13/460,276

(22) Filed: Apr. 30, 2012

(65) Prior Publication Data

US 2012/0328235 A1 Dec. 27, 2012

Related U.S. Application Data

(60) Provisional application No. 61/506,421, filed on Jul. 11, 2011, provisional application No. 61/482,390, filed on May 4, 2011, provisional application No. 61/480,826, filed on Apr. 29, 2011.

(51) Int. Cl.
  *G02B 6/12* (2006.01)
  *H04B 10/80* (2013.01)
  *H01S 5/022* (2006.01)
  *H01S 5/42* (2006.01)

(52) U.S. Cl.
  CPC .......... *H04B 10/801* (2013.01); *H01S 5/02276* (2013.01); *H01L 2224/16225* (2013.01); *H01S 5/423* (2013.01)

(58) Field of Classification Search
  CPC .......... G02B 6/42; G02B 6/43; G02B 6/4214; G02B 6/12004; G02B 6/12007; H04B 10/801; H01S 5/02276
  USPC .......................................... 385/14
  See application file for complete search history.

(56) References Cited

U.S. PATENT DOCUMENTS

| | | | |
|---|---|---|---|
| 5,355,237 A * | 10/1994 | Lang et al. | 385/14 |
| 5,440,620 A * | 8/1995 | Slusky | 379/100.07 |
| 7,412,122 B2 | 8/2008 | Abrams et al. | |
| 2003/0007717 A1* | 1/2003 | Chiappetta et al. | 385/14 |
| 2006/0177174 A1 | 8/2006 | Abrams et al. | |
| 2008/0152286 A1 | 6/2008 | Ueno et al. | |
| 2011/0044367 A1 | 2/2011 | Budd et al. | |
| 2011/0084622 A1* | 4/2011 | Barrow et al. | 315/250 |
| 2011/0175221 A1* | 7/2011 | Ni et al. | 257/737 |

OTHER PUBLICATIONS

S.-K. Kang et al., "Multichip optical transmitter module for chip-to-chip interconnection on optical PCBs", Electronics Letters, vol. 42, No. 14, pp. 805-806, Jul. 6, 2006.
Li Zhiqun et al., "Design of a 12-Channal 120-Gb/s Optical Receiver Front-End Amplifier in 0.18-im CMOS Technology"; Photonics and Optoelectronic (SOPO), 2010 Symposium, pp. 1-4, Jun. 19-21, 2010.
(Continued)

*Primary Examiner* — Jerry Blevins
(74) *Attorney, Agent, or Firm* — Buchanan Ingersoll & Rooney PC

(57) ABSTRACT

The present invention relates to a flexible method of provide chips for optical interconnect with different number of channels.

25 Claims, 17 Drawing Sheets

(56) References Cited

OTHER PUBLICATIONS

K.E. Arms et al., "Atlas pixel opto-electronics"; Section A Accelerators, Spectrometers, Detectors and Associated Equipment, Nuclear Instruments & Methods in Physics Research, Dec. 1, 2005, vol. 554, No. 1-3, pp. 458-468.

Wei Tang et al., "3,125Gbit/s low power truly-differential parallel optical receiver module in 0.13μm CMOS", Circuits and Systems, 2005, 48$^{th}$ Midwest Symposium on, pp. 400-404, vol. 1, Aug. 7-10, 2005.

* cited by examiner

MODULAR CHIP LAYOUT FOR ACTIVE OPTICAL LINKS

In one embodiment this document describes the implementation of a chipset for a modular active optical link. In one embodiment the chipset consists of 4 Channel General Purpose transmitter and receiver.

BACKGROUND

One approach to support the communication requirements of the future includes utilizing optical interconnects, i.e. links, as an alternative to electrical wire-based interconnections. Currently, manufacturers produce products such as modules for optical interconnects and so-called optical cables. An optical module may be a transmitter (i.e. comprising a light source for transmitting an optical data signal), a receiver (i.e. comprising a photo detector for receiving an optical data signal) or a transceiver which is a combined receiver and transmitter. Often modules come with a connector for connecting one or more optical fibers for transporting the optical data signal. In an optical cable the module and fiber is typically pre-connected. It is also possible to have the module or the components of the module mounted directly on a circuit board, such as a motherboard for a computer for example for interconnects in a supercomputer or as a connection to peripheral equipment such as in the "Light Peak" and "Thunderbolt" technologies developed by the Intel Corporation.

In the context of the present invention an optical module refers in general to the system comprising optoelectronic components for transmitting or receiving an optical signal connected to driver and/or receiver electronics. Optoelectronic components are in the present context devices arranged to convert electrical energy into optical energy or optical energy into electrical energy, i.e. light sources and photo detectors such as laser diodes (often VCSELs) and photodiodes. Typically a module will also comprise an interface allowing the module to be connected to one or more optical fibers as well as control electronics to adjust the operating parameters of optoelectronic components. For example, operation of a laser diode typically requires an adjustable bias current, modulation current and optionally preemphasis. Often the modules will support more than one channel such as 2, 4, 8, 12 and 16 channels but any number of channels is conceivable depending on the application. For such use the light sources and photo detector are often available in arrays, such as 1×N arrays or 2×N where is N is a positive integer. Strictly, a 2×N array is referred to as a matrix, but in order to simplify notation these terms are used interchangeably.

In order to convert the electric data signal into a signal suitable for driving a light source to emit an optical signal comprising this data signal a driver circuit is required. Similarly a receiver circuit is required to convert the received optical signal to an electrical signal suitable for further transmission in the system. Such driver and receiver circuits are well-known in the art and they are typically provided as integrated circuits either as driver chips (comprising driver circuit(s)), transmitter chips (comprising driver circuit(s)), or transceiver chips (comprising a driver and receiver circuit(s)). In the context of the present invention the terms driver chip and transmitter chip are used interchangeably. A receiver chip may also be referred to as a TIA chip, a TIA+LIA chip or a TIALA the latter types explicitly mentioning the limiting amplifier which often a part of a TIA chip. The chips comprise data pins/pads for receiving/transmitting the electrical data signal to/from the host system (i.e. data pads are pads for connecting to the system side) and connecting pads for connecting to the optical devices (i.e. connecting pins/pads are for connecting to the optical side of chip i.e. light sources or photo detectors). In the present context the terms "pin", bump, and "pad" are used interchangeably and refers in general to a connection node for external connection to the circuit on the chip.

The transmitter or receiver circuit may be divided into
- channel circuit(s), which convert between the electrical data signal and the signal to/from the optical device sometime also referred to as the high-speed path,
- auxiliary circuitry often comprises monitoring and/or control functions suitable for adjustment/surveillance of the performance and/or logical state of the channel circuit. It may also comprise circuitry and components such as voltage references, current references and thermometer. Other functions of the auxiliary circuitry may include functions to ensure eye safety, detection of valid data in the channel circuit(s) and RSSI (received signal strength indication). Often, the control circuit is accessible via a digital interface. In chips with multiple channels, i.e. having multiple channel circuits and connectors suitable for connecting to multiple optical devices, often at least a portion of the auxiliary circuitry is shared between the channel circuits.

SUMMARY OF THE INVENTION

The inventors has realized that the diversity of the present market for driver, transmitter and receiver chips (hereinafter "optical chips") may be handled more efficiently. Today it is practice to design individual products of chips with the number of channels required for a specific application, e.g. a 4 channel driver chip is a different product/design from a 12 channel driver chip, even if the channel circuits are identical in function and/or layout.

To facilitate more efficient design and production the invention relates in one embodiment to a chip, a wafer, a module, system and a method of producing the same. On the wafer a series of individual integrated circuits (in this context also referred to as integrated devices or just circuit when otherwise clear) each supporting a number of channels. A chip can then be cut from the wafer supporting either the number of channels supported by a single integrated circuit or the number of channels supported by a combination of multiple integrated circuits. In this way chips supporting various number of channels may be provided using the same wafer layout allowing a cost effective approach to accommodate various requirements on the number of channels available on receiver, driver and/or transceiver chips. To simplify notation the phrase "wherein each comprising N channels" refers in one embodiment to each having a number of channels but N is not necessarily the same number for each. Integrated circuits with varying number of channels on the same wafer may in one embodiment be used to provide added variability in the number of channels obtainable by combining the circuits. Consider, as an example, a wafer with 3-channel and 5-channel circuit arranged in alternating order. Such a wafer may provide 3 channel chips, 5 channel chips, 8 channel chips as 3+5, 11 channels chips as 3+5+3, 13 channel chips as 5+3+5 and so on. In one embodiment N is the same number for all of the mentioned circuits. One wafer with multiple 4 channel devices may for example provide 4 channel chips for one application and 16 channels chips for another application. In the latter case a piece of the wafer comprising 4 integrated circuits are produced, such as sawn, cut or scribed/broken, from the wafer. In the following the term sawn is understood to be equivalent to other methods of separating chips from a wafer. In one embodiment at least a part of the integrated circuits laid out on the wafer are substantially identical each supporting N channels. The wafer then allows for chips supporting N, or multiple of N, channels to be produced from the wafer by sawing a chip holding a single or multiple of such integrated circuits from the wafer. N may in principle be any suitable number such as 2, such as more than or equal to 3, such as more than or equal to 4, such as more than or equal to 5, such as more than or equal to 6, such as more than or equal to 7, such as more than or equal to 8, such as more than or equal to 9, such as more than or equal to 10, such as more than or equal to 11, such as more than or equal to 12, such as more than or equal to 13, such as more than or equal to 14, such as more than or equal to 15, such as more than or equal to 16. A lower number of channels per circuit increase the degree of freedom with which the number of channels on the chip can be selected, but may result in increased waste of chip area due to a high number of spacings relative to the number of channels. The number of integrated circuits on the chip can in principle be any suitable number depending on the application, such as M≥1 integrated circuits, such as M≥2, such as M≥3, such as M≥4, such as M≥5, such as M≥6, such as M≥7, such as M≥8, such as M≥9, such as M≥10, such as M≥11, such as M≥12, such as M≥13, such as M≥14, such as M≥15, such as M≥16.

In one embodiment the invention relates to an optical module or optical system for optical communication of high-speed data comprising a. one or more arrays of optoelectronic devices,
b. a dividable chip electrically connected to optoelectronics devices of said array, said chip comprising M≥2 integrated circuits, each integrated circuit comprising
  i. one or more channel-circuits each arranged to provide a high speed data stream to one of the optoelectronic device in the array(s) via at least one connection pad or arranged to receive a high speed data stream from one of the optoelectronic device in the array(s) via at least one connection pad, and
  ii. a digital interface arranged to receive management data for adjusting one or more of said channel-circuits, such as digital control of operating parameters of said channel circuits via an input to said digital interface.

In one embodiment the system is (at least a part of) a transmitter driver module, receiver module or a transceiver module.

The chip may be connected to more than one array of optoelectronic devices. Typically the optoelectronic devices in an array are identical but they may in principle vary in specifications, in type, or in number of channels per device/chip. These arrays can be arrays of optoelectronic components of the same type (e.g. detectors or light sources). In a preferred embodiment the chip is connected to a single array of a specific type, so that, for example, a receiver chip is connected to a single array of photodiodes, a driver chip is connected to a single array of light sources and a transceiver chip is connected to a single array of each. This will typically allow for closer spacing of the light sources and may allow for easier optical connection and/or shorter electrical connections between the chip and the optoelectronic components. In one embodiment channel circuits of 2 or more of said M≥2 integrated circuits are connected to the optoelectronic devices of a single array.

In one embodiment the invention relates to a chip comprising M≥2 integrated circuits, each integrated circuit comprising c. one or more channel-circuits each arranged to provide a high speed data stream to or receive a high speed data stream from an optoelectronic device, and
d. a digital interface arranged to allow adjustment, such as digital control, of operating parameters of said channel circuits via an input to said digital interface, wherein said chip is dividable so that a spacing d between the M integrated circuits allows the chip to be divided via a cut into subsections each comprising at least one of said M integrated circuits and said at least one of said M integrated circuits are operable after division.

In the present context a dividable chip means that the chip may be divided so the resulting subparts comprising one or more of integrated circuits of the original chip. The subparts are operable and may function as individual chips, i.e. the channel-circuits of the integrated circuit(s) can transmit or receive high speed data via an optoelectronic component transfer and the digital interface can be applied to adjust operating parameters of the channel circuits. In one embodiment it is impractical, difficult or impossible to divide the dividable chip physically, for example due to difficulties in mechanical handling of the chip. However, it would have been possible to form chips corresponding to the subsections during production such as when dividing the wafer into chips, i.e. the chip comprises sufficient spacing between two or more of the integrated circuits to allow separation at least during production. Typically the integrated circuits are not connected electrically on the chip; however, as discussed below, in some embodiments one or more connections exist. In the latter case the integrated circuits are arranged to allow operability if such connection is broken. In one embodiment the presence of a neighboring integrated circuit may be determined by whether such a connection is broken or not.

In one embodiment the digital interface is further arranged to allow reading status data from the chip such as temperature, input signal detection, supply alarm, and RSSI.

In one embodiment the operation of the individual integrated circuits of the chip depend on whether other circuits are present on the chip and/or the relative location of the circuit. For instance, a module controller arranged to ensure may need to adjust the operating properties of channel 5 in an 8 channel chip formed by two 4-channel integrated circuits. In one embodiment the controller is individually connected to the digital interface of each integrated circuit. However, in one embodiment it is advantageous to connect the intergrated circuits to a common bus (e.g. SPI or I²C (also referred to as I2C)) such as to limit the number of required connections and/or simplify the interface of the controller. Accordingly, in one embodiment the invention relates to an integrated circuit on a chip said integrated circuit comprising one or more channel-circuits each arranged to provide a high speed data stream to an optoelectronic device or arranged to receive a high speed data stream from an optoelectronic device and a digital interface arranged to receive management data for adjusting one or more of said channel-circuits, such as digital control, of operating parameters of said channel circuits via an input to said digital interface wherein said integrated circuit is arranged to allow addressing of said circuit on said digital interface relative to an optional neighboring integrated circuit on said chip. In the present context the term "neighboring" indicates that the circuits are on the same chip and the term "addressing" means any arrangement allowing the controller to specify which integrated circuit on the chip to communicate with. Examples include arrangements such as a digital address which is at least unique for the chip (i.e. a chip-unique address) and an enable pin which can be used to enable communication. In one embodiment the circuit is further arranged to allow detection of the position of the integrated circuit relative to an optional neighboring integrated circuit on said chip. In one embodiment this allows a correspondence between the optical channel number (e.g. channel 5) and the integrated circuit being addressed. Such corresponding may be beneficial for example when optimizing the optical link so that a system indication that the optical signal strength on channel 5 is insufficient can be followed by e.g. adjusting the $1^{st}$ channel-circuit on the second integrated circuit on the chip to increase the modulation current for the light source.

In one embodiment the dividable chip comprises seal rings (also referred to as guard rings) surrounding each of the integrated circuits. Seal rings are commonly used in IC manufacturing to protect the individual ICs of a wafer. Commonly a design rule prohibits electrical connections through the guard ring so for such embodiment any pads for connection to the circuit, e.g. the connection pads and/or data pads, are located within said seal ring. Note that such a ring is not necessarily circular but more often substantially square.

In one embodiment, the width and distance d between the integrated circuits is arranged so that a number of consecutive integrated circuits may be cut from the wafer as needed while still allowing for connection to a single array of the optical devices. One limiting factor for such connection is the maximum length of the electrical connection from the chip to an optoelectronic device in the array. Signal distortion and/or attenuation due to the connection often increases with length of the connection and bandwidth of the signal. Is therefore often advantageous to keep the connections short particularly for higher bit rate signals, i.e. high speed data, such as 10 Gbit or higher, such as 12 Gbit or higher, such as 14 Gbit or higher, such as 18 Gbit or higher, such as 20 Gbit or higher, such 25 Gbit or higher, such as 30 Gbit or higher, such as 40 Gbit or higher, such 50 Gbit or higher. Depending on properties of the link such as bit-error rate requirements, optical link loss budget, efficiency of equalization, receiver sensitivity longer connections may in some instances be tolerated. In one embodiment a maximum length of 5 mm or shorter is tolerable, such as a maximum length of 2.5 mm or shorter, such as a maximum length of 2 mm or shorter, such as a maximum length of 1.5 mm or shorter, such as a maximum length of 1 mm or shorter, such as a maximum length of 900 µm or shorter, such as a maximum length of 800 µm or shorter, such as a maximum length of 700 µm or shorter, such as a maximum length of 600 µm or shorter, such as a maximum length of 500 µm or shorter, such as a maximum length of 400 µm or shorter, such as a maximum length of 300 µm or shorter, such as a maximum length of 200 µm or shorter. In one embodiment the length of the electrical connection is provided between a connection pad on the chip and a pad on the optoelectronic device e.g. a VCSEL.

A typical array of optoelectronic devices is a 1×N or 2×N array so that the devices are laid out in a straight line (see e.g. FIG. 6). In one embodiment the connection pads for connecting to optoelectronic devices of the array are in one embodiment placed substantially along a straight line. This may have the effect to keep the connections short and/or may be practical in the layout of the channel circuits which may be laid out parallel to one another ending on one end with the connection pad(s). In one embodiment the chip is designed to have a specific orientation relative to the array. This orientation may for example allow shorter connections to the array than other orientation or a short maximum length of the connections to the chip. In one embodiment the width of chip is measured as the maximum length of the chip along an axis parallel to be placed one side of the chip. The chip is commonly rectangular and said orientation is so two sides of the chip are parallel to the array. Accordingly, the length of the chip along either of these sides is referred to as the width of the chip. In one such embodiment the chip is arranged to be placed with one side closest to the array in which case this side is referred to as the device sides. In one embodiment the connection pads of the chip are arranged substantially along one side which is then referred to as the device side. In one embodiment the chip comprises more than one of the integrated circuits (i.e. M≥2). In one embodiment the integrated circuits are laid out as a 1×M array and the width of the chip is length of the chip along the direction where the M circuits are laid out. Typically, the width of the chip is substantially equal to the sum of the widths of the M individual integrated circuits (i.e. measured parallel to the width of the chip) plus the sum of spacing between them.

In one embodiment the chip is arranged to the have the array mounted on top of the chip. In one such embodiment the array is flip-chip mounted on the chip. In one embodiment the array is a P×N matrix/array where P is equal to 2 or higher. In one embodiment the integrated circuits of the chip are laid out in a corresponding P×M matrix/array. In one embodiment the dividable chip is suitable for flip-chip mounting which is an effective technique for mass production. In one embodiment the connections between the chip and the array are made by wire-bonding. In one embodiment the connection is formed via traces on a circuit board on which both chip and array is mounted (see e.g. FIGS. 6 and 8).

In one embodiment each integrated circuit defines a circumscribed rectangle on said chip having at least one device side substantially along which said connecting pads are arranged. The circumscribed rectangle is in one embodiment defined as the closest fitting rectangle surrounding the integrated circuit. For embodiments where the integrated circuits are connected via connections designed to be broken if the chip is divided such connections are ignored in defining the circumscribed rectangle. In one embodiment the integrated circuit comprises a seal ring surrounding the circuitry of the integrated circuit wherein said seal rings defines said circumscribed square even if the shape deviates from a square. In one embodiment data pads of said integrated circuit are substantially arranged along the opposing side to said connection pads. In one embodiment this allows the channel-circuits to be arranged in parallel from one side to the other and/or convenient access to the data pads on one side of the chip and connection pads on the other. This is illustrated in FIGS. 6 and 8.

As noted above, it is often preferential to keep the length of the connections between chip and the optoelectronic devices short. To limit the length of the connections between the chip and the optoelectronic devices, the dividable chip is in one embodiment arranged so the width of the chip measured in parallel to said array is less than 1000 µm longer than said array, such as less than 800 µm longer than said array, such as less than 700 µm longer than said array, such as less than 600 µm longer than said array, such as less than 500 µm longer than said array, such as less than 400 µm longer than said array, such as less than 300 µm longer than said array, such as less than 100 µm longer than said array, such as substantially equal to said array. Similarly, the dividable chip is in one embodiment arranged so the width of the chip measured in parallel to said array is less than 1000 µm shorter than said array, such as less than 800 µm shorter than said array, such as less than 700 µm shorter than said array, such as less than 600 µm shorter than said array, such as less than 500 µm shorter than said array, such as less than 400 µm shorter than said array, such as less than 300 µm shorter than said array, such as less than 200 μm shorter than said array, such as less than 100 μm shorter than said array, such as substantially equal to said array.

In one embodiment the width of the chip and the array depends on the width each channel circuit on the chip. In one embodiment said chip is arranged so that said optoelectronic devices can suitably be arranged in an array where said chip has a width parallel to such an array meaning the connection pads are arranged on the chip so that the chip may be placed relative to said array so the length of the connections are not too long as laid out above. In one such embodiment the width of the chip measured as the longest length of the chip parallel to the long side of the array is equal to the total number of channel circuits on said chip multiplied by 400 μm or less, such as 375 μm or less, such as 350 μm or less, such as 325 μm or less, such as 300 μm or less, such as 275 μm or less, such as 250 μm or less, such as 225 μm or less, such as 200 μm or less, such as 175 μm or less, such as 150 μm or less, such as 125 μm or less, such as 100 μm or less. In one embodiment said width is equal to the total number optoelectronic devices in the array multiplied by 400 μm or less, such as 375 μm or less, such as 350 μm or less, such as 325 μm or less, such as 300 μm or less, such as 275 μm or less, such as 250 μm or less, such as 225 μm or less, such as 200 μm or less, such as 175 μm or less, such as 150 μm or less, such as 125 μm or less, such as 100 μm or less. In one embodiment said width is equal to the total number optoelectronic devices in the array connected to said chip multiplied by 400 μm or less, such as 375 μm or less, such as 350 μm or less, such as 325 μm or less, such as 300 μm or less, such as 275 μm or less, such as 250 μm or less, such as 225 μm or less, such as 200 μm or less, such as 175 μm or less, such as 150 μm or less, such as 125 μm or less, such as 100 μm or less.

In one embodiment, the width of the array depends on the pitch, i.e. the center to center distance, between two adjacent optoelectronic components. In one embodiment said pitch $\Lambda$ is less than or equal to 500 μm, such as less than or equal to 400 μm, such as less than or equal to 300 μm, such as less than or equal to 250 μm, such as less than or equal to 200 μm, such as less than or equal to 150 μm, such as less than or equal to 125 μm, such as less than or equal to 100 μm, such as less than or equal to 75 μm, such as less than or equal to 50 μm. In practice the pitch if often designed to match the pitch between optical fibers in a fiber bundle (commonly 250 μm) or simply the closest spacing possible of the optoelectronic devices.

As noted above the integrated circuits are in embodiment spaced apart by a distance d which allow the chip to be divided, such as by sawing from a wafer. In one embodiment the circumscribed rectangles are spaced apart a distance d. In a preferred embodiment (see also FIGS. 6 and 8 exemplifying such an embodiment), the width of the integrated circuit plus d is equal to the number of channels-circuits in the circuit which are (or can be) connected to the circuit multiplied by the pitch $\Lambda$. Accordingly, the length of said device side is substantially equal to $N\cdot\Lambda-d$ where N is the number of channel circuits arranged to be connected to an optical device of the array. For this special case expansion of the number of channels on the chip by incorporating multiple integrated circuits in an 1×M matrix as well as expanding the array with the corresponding number of channel will result in a chip having a width which is about the distance d shorter than the array regards of the value of M. Accordingly, this case provides for high degree of flexibility in the number of channels that can be included on the chip without requiring connections that are too long. Typically, d can be relatively narrow such as less than the pitch $\Lambda$, such as $d\leq10.9\Lambda$, such as $d\leq10.9\Lambda$, such as $d\leq10.8\Lambda$, such as $d\leq10.7\Lambda$, such as $d\leq10.6\Lambda$, such as $d\leq10.5\Lambda$, such as $d\leq10.4\Lambda$, such as $d\leq10.3\Lambda$, such as $d\leq10.2\Lambda$, such as $d\leq0.1\Lambda$.

In one embodiment the mismatch between the width of the chip and the array depends on the number of integrated circuits on the chip and the mismatch between the widths of the individual integrated circuits and the width of the section of the array the circuit is arranged to interact with. Accordingly, in one embodiment each integrated circuit of the chip defines a circumscribed rectangle on said chip having at least one device side substantially along which said connecting pads are arranged and the length of said device side is less than or equal to $N\cdot\Lambda+500$ μm, such as less than or equal to $N\cdot\Lambda+400$ μm, such as less than or equal to $N\cdot\Lambda+300$ μm, such as less than or equal to $N\cdot\Lambda+200$ μm, such as less than or equal to $N\cdot\Lambda+100$ μm, such as less than or equal to $N\cdot\Lambda$ where N is the number of channel circuits in said integrated circuit.

In one embodiment the each integrated circuit of the chip defines a circumscribed rectangle on said chip having at least one device side substantially along which said connecting pads are arranged and the length of said device side is equal to the number of channel circuits in said integrated circuit multiplied by 400 μm or less, such as 375 μm or less, such as 350 μm or less, such as 325 μm or less, such as 300 μm or less, such as 275 μm or less, such as 250 μm or less, such as 225 μm or less, such as 200 μm or less, such as 175 μm or less, such as 150 μm or less, such as 125 μm or less, such as 100 μm or less. In one embodiment this allows for a compact chip. In one embodiment the length of said device side is equal to the number of channel circuits in said integrated circuit multiplied by a factor equal to the pitch of the array plus 100% or less, such as 75% or less, such as 50% or less, such as 25% or less, such as 10%, such as 5% or less. In one embodiment the factor is equal to the pitch of the array minus 75% or less, such as, such as 50% or less, such as 25% or less, such as 10%, such as 5% or less Often the integrated circuits of a chip will be substantially identical whether it is driver circuits, receiver circuits or transceiver circuits. Differences not related to the function are ignored in one embodiment, such as hardwiring of a chip-unique address into the circuit during production. In one embodiment at least one of said integrated circuits is a light source driver circuit with N channels for driving N light sources, such as two or more of said integrated circuits, such as three or more of said integrated circuits, such as four or more of said integrated circuits. In one embodiment at least one of said integrated circuits is a receiver circuit with N channels for receiving the received photocurrent from N photo detectors, such as two or more of said integrated circuits, such as three or more of said integrated circuits, such as four or more of said integrated circuits. In one embodiment at least one of said integrated circuits is a transceiver circuit with N−X channels for receiving the received photocurrent from N minus X photo detectors and X channels for driving X light sources, such as two or more of said integrated circuits, such as three or more of said integrated circuits, such as four or more of said integrated circuits. In one embodiment the circuit has an equal number of driver and receiver channels so that X=N/2. In one embodiment driver chip, receiver chips and transceiver chips may be obtained from the same wafer by combining driver circuits (i.e. integrated circuit only comprising channel-circuits for driving light sources) and receiver circuits (i.e. integrated circuit only comprising channel-circuits for receiving a detected photocurrent). Accordingly, in one embodiment at least one of said integrated circuits is a receiver circuit comprising Y channels for receiving the received photocurrent from Y photo detectors and at least one of said integrated circuits is a light source driver circuit with N channels for driving N light sources. In one such embodiment alternating integrated circuits with driver and receiver channels. Then driver and receiver chips may be formed separately from the wafer or cut out together to form a transceiver chip. The number of channels on the transceiver chip may further be increased by increasing the number of driver and receiver integrated circuits on the chip. If a transceiver with 16 channels in each direction is desired then 4 receiver integrated circuits and 4 transmitter integrated circuits may be placed in parallel.

In order to the accommodate the requirement of maximum length of the electrical connection when connect connection to a single array of optical devices or two arrays (an array of light sources and an array of photo detectors) for a transceiver chip the integrated circuit will in one embodiment conform a requirement of the width measured perpendicular to the high speed channels. In one such embodiment the invention relates to a chip comprising M≥1 integrated circuits each for interfacing to N≥1 optoelectronic devices, arranged in an array with a pitch Λ, each integrated circuit comprising N channel-circuits each arranged to provide or receive a high speed data stream with one of said optoelectronic devices and for each of said N channel circuits comprising a. at least one data pad for sending or receiving data from said optoelectronic device via said channel circuit, b. at least one connecting pad for connecting said channel circuit to said respective optoelectronic device, said integrated circuit being arranged on a substrate and defining a circumscribed rectangle having at least one device side substantially along which said connecting pads are arranged and said optoelectronic devices are wherein the length of said device side is less than or equal to N·Λ. As described above, there is in one embodiment multiple integrated circuits on a chip so that M≥2 and/or typically each integrated circuit support multiple channels so that N≥2.

In one embodiment the device side is arranged to be parallel with the array. In one embodiment the width of the integrated circuit (along the device side) plus the length of the spacing to the next integrated circuit is arranged to be substantially equal to the length of a part of the array holding a number of optoelectronic devices equal to the number of corresponding channels in the circuit. In this case a chip holding a single integrated circuit and a chip holding 4 integrated circuits will both be substantially equal in length to an array with the corresponding number of channels. In one embodiment both chips are one spacing shorter than the array.

EXAMPLES AND DETAILS OF THE INVENTION

The invention will be explained more fully below in connection with a preferred embodiment and with reference to the drawings.

Figure 5:
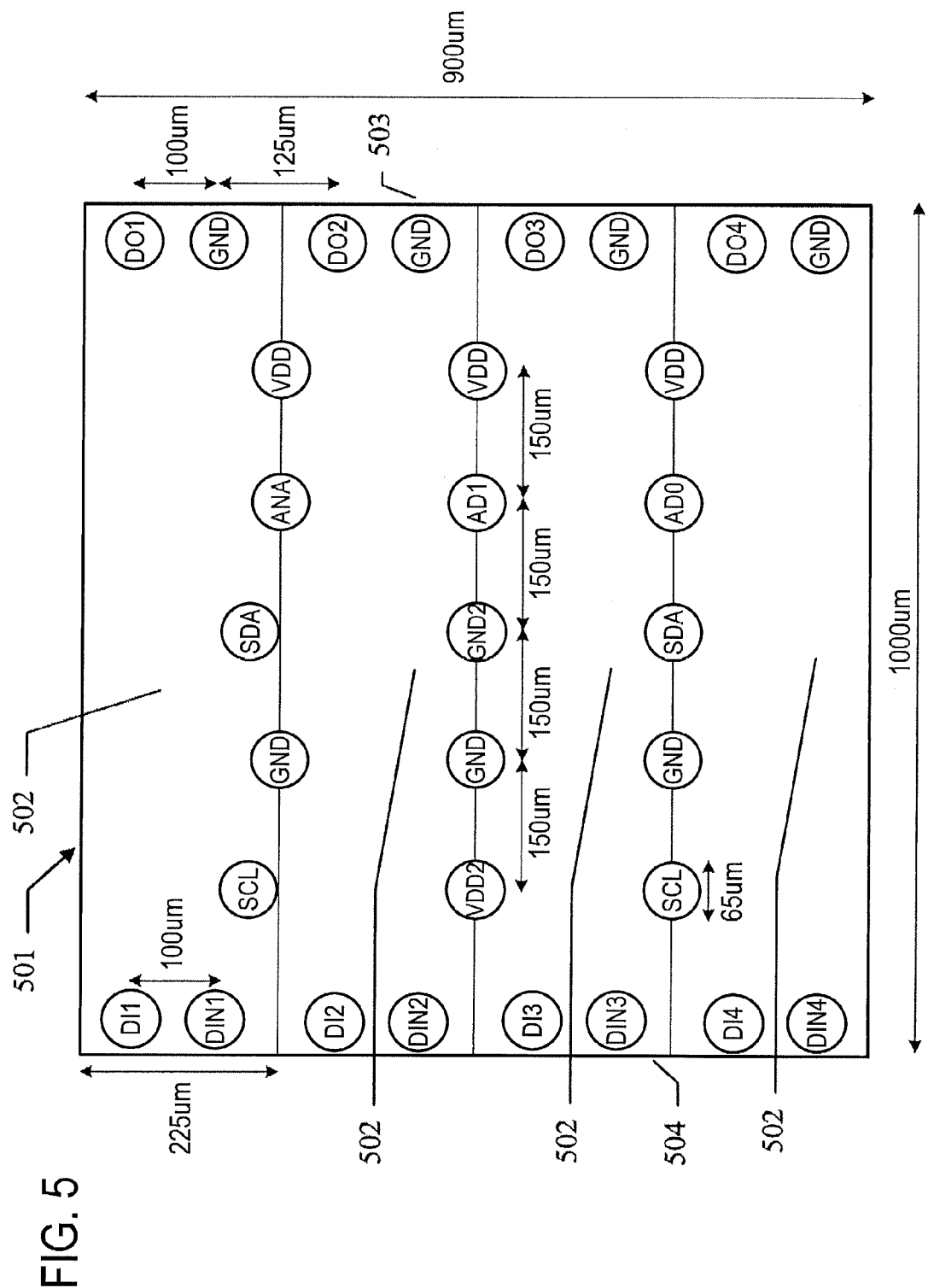
FIG. 5 shows an exemplary floor plan of a transmitter integrated circuit (here a VCSEL driver).
Figure 6:
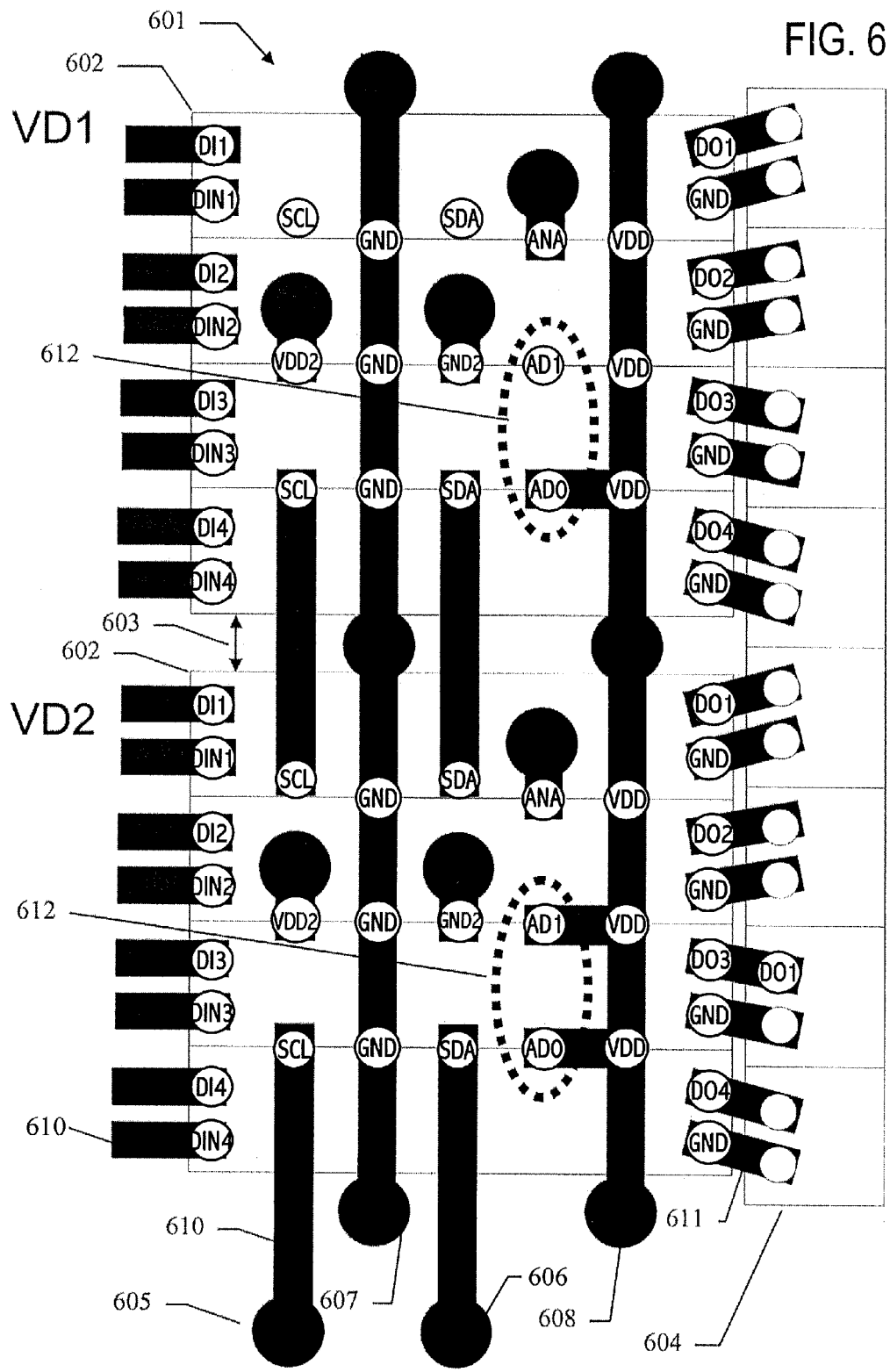

FIG. 6 shows an exemplary pad out and substrate board layout example with VIAs for mounting a single chip with two transmitter integrated circuits according to FIG. 5 in parallel—connected to a 1×8 VCSEL array on 250 μm pitch. VD 1 and VD 2 refers to VCSEL driver integrated circuit 1 and 2, respectively, each comprising 4 channels.

Figure 7:
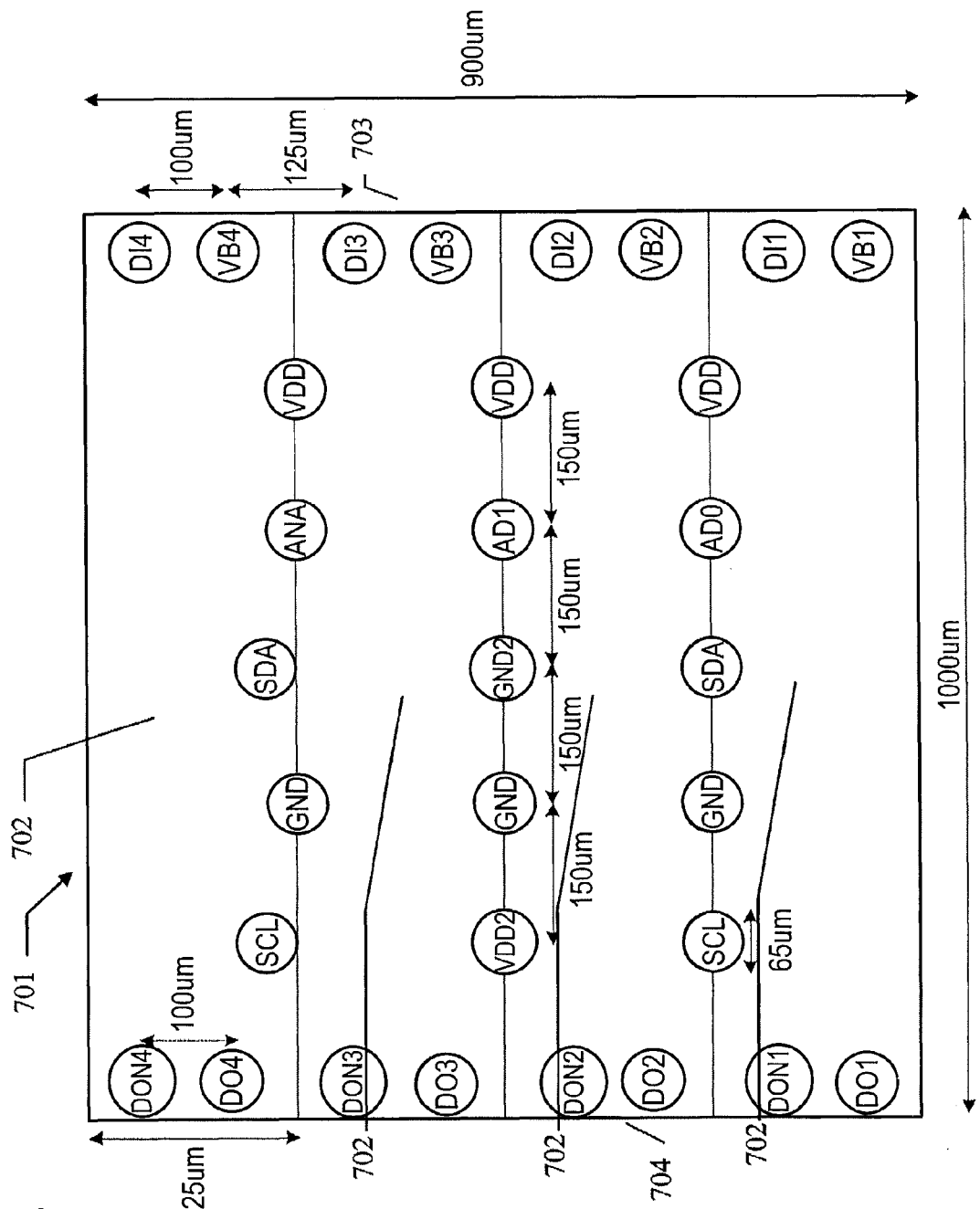

FIG. 7 show an exemplary floor plan of a receiver integrated circuit.

Figure 8:
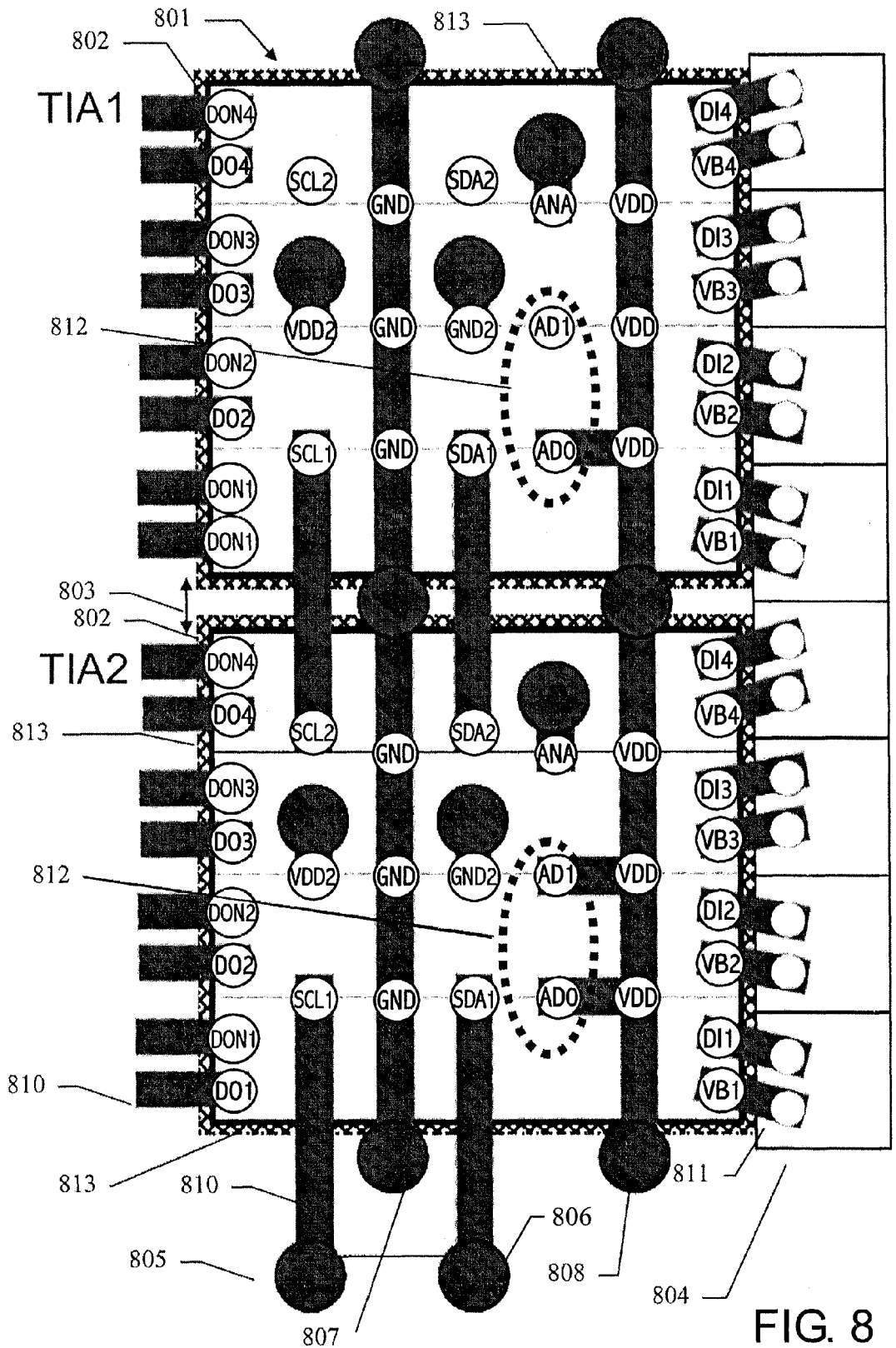

FIG. 8 shows an exemplary pad out and substrate board layout similar to that of FIG. 6 but instead with two receiver integrated circuits according to FIG. 7 in parallel.

Figure 9:
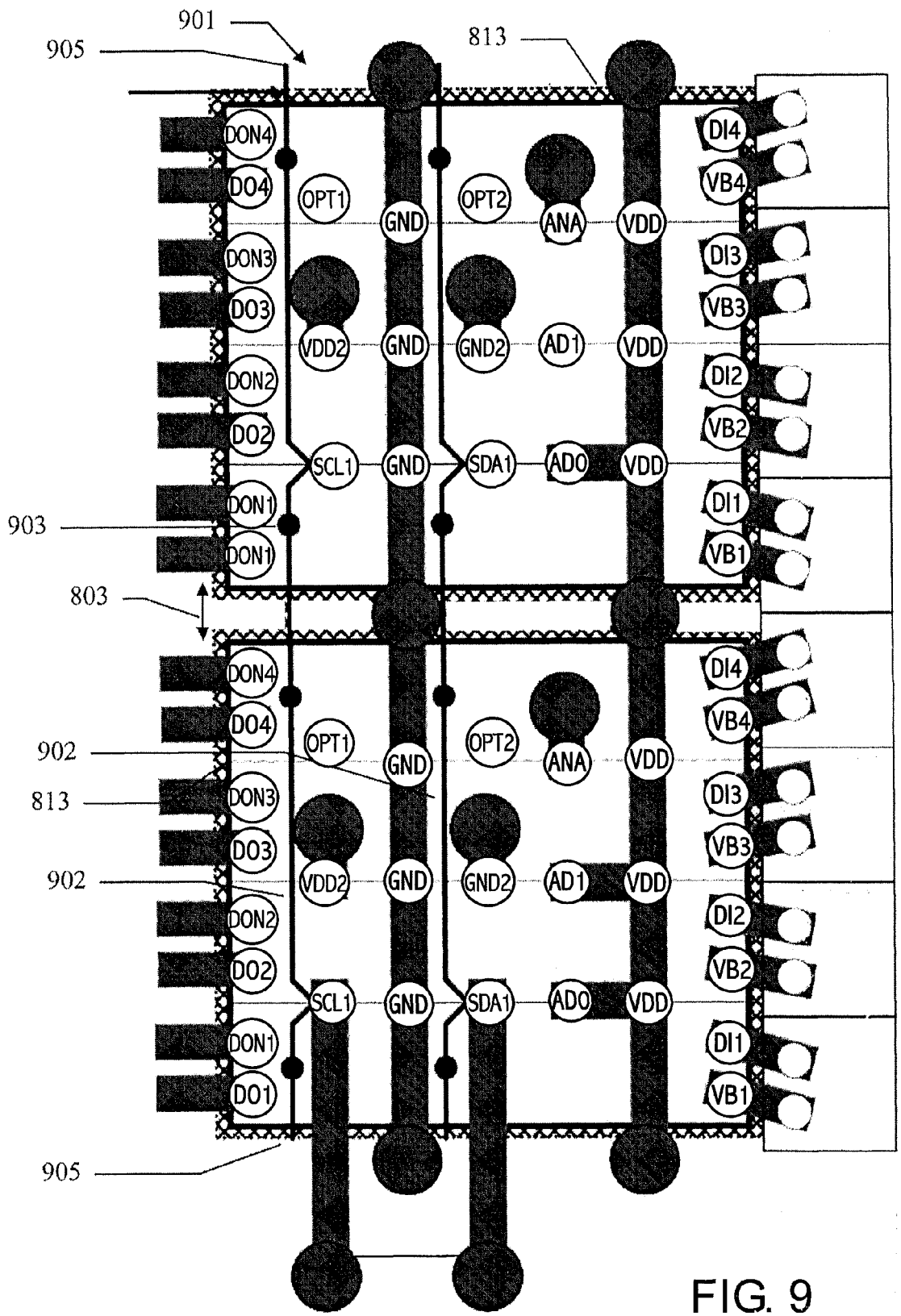

FIG. 9 is similar to FIG. 8. However, in this case the integrated circuits are connected.

Figure 10:
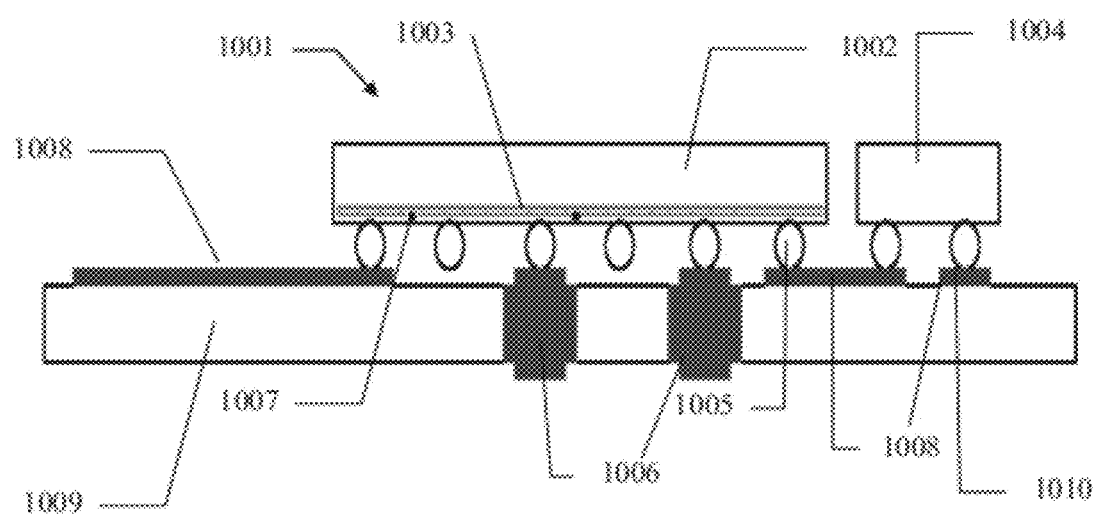

FIG. 10 shows a schematic cross sectional view of a mounted chip on the substrate such the mount shown in FIGS. 6 and 8.

Figure 11:
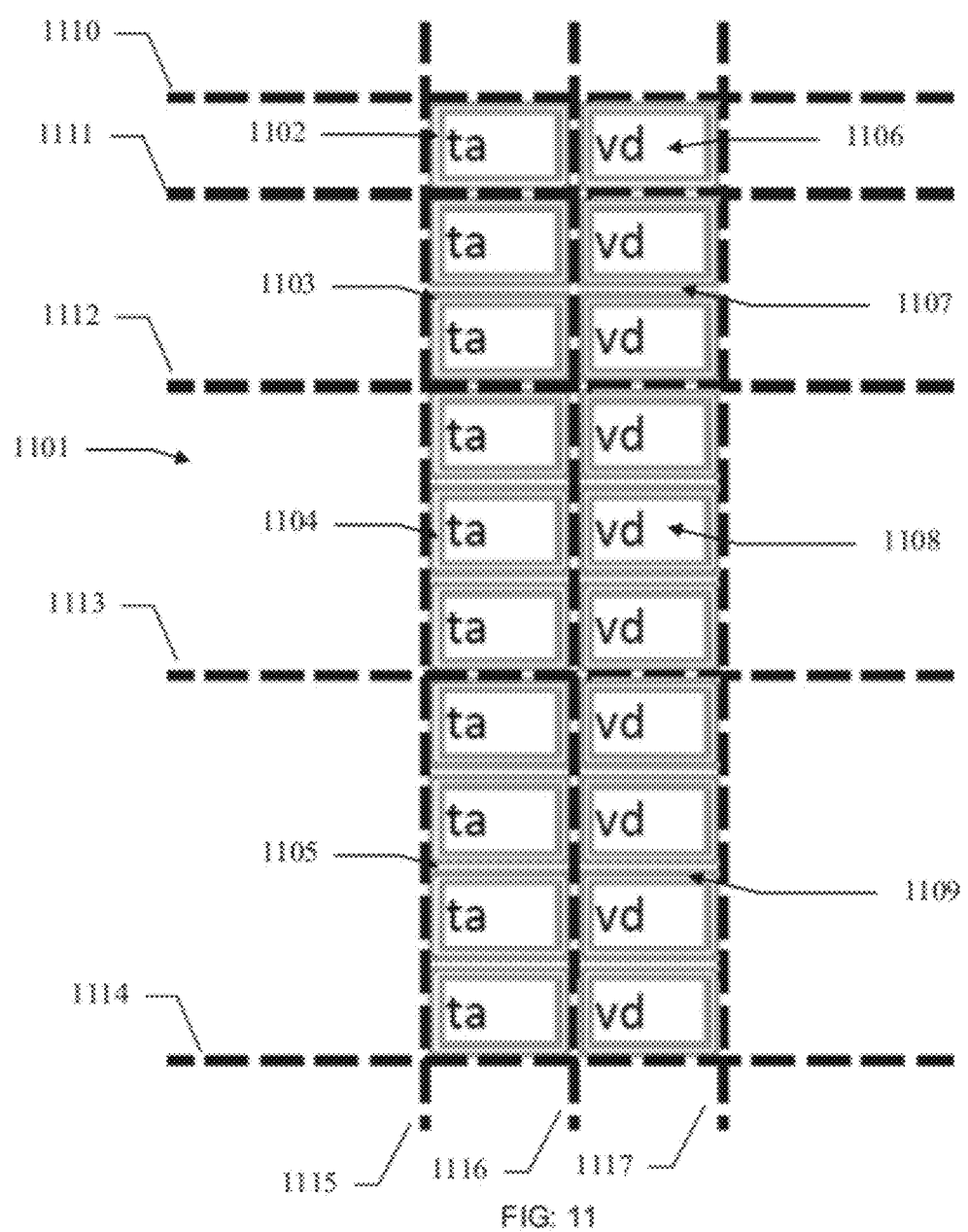
Figure 11B:
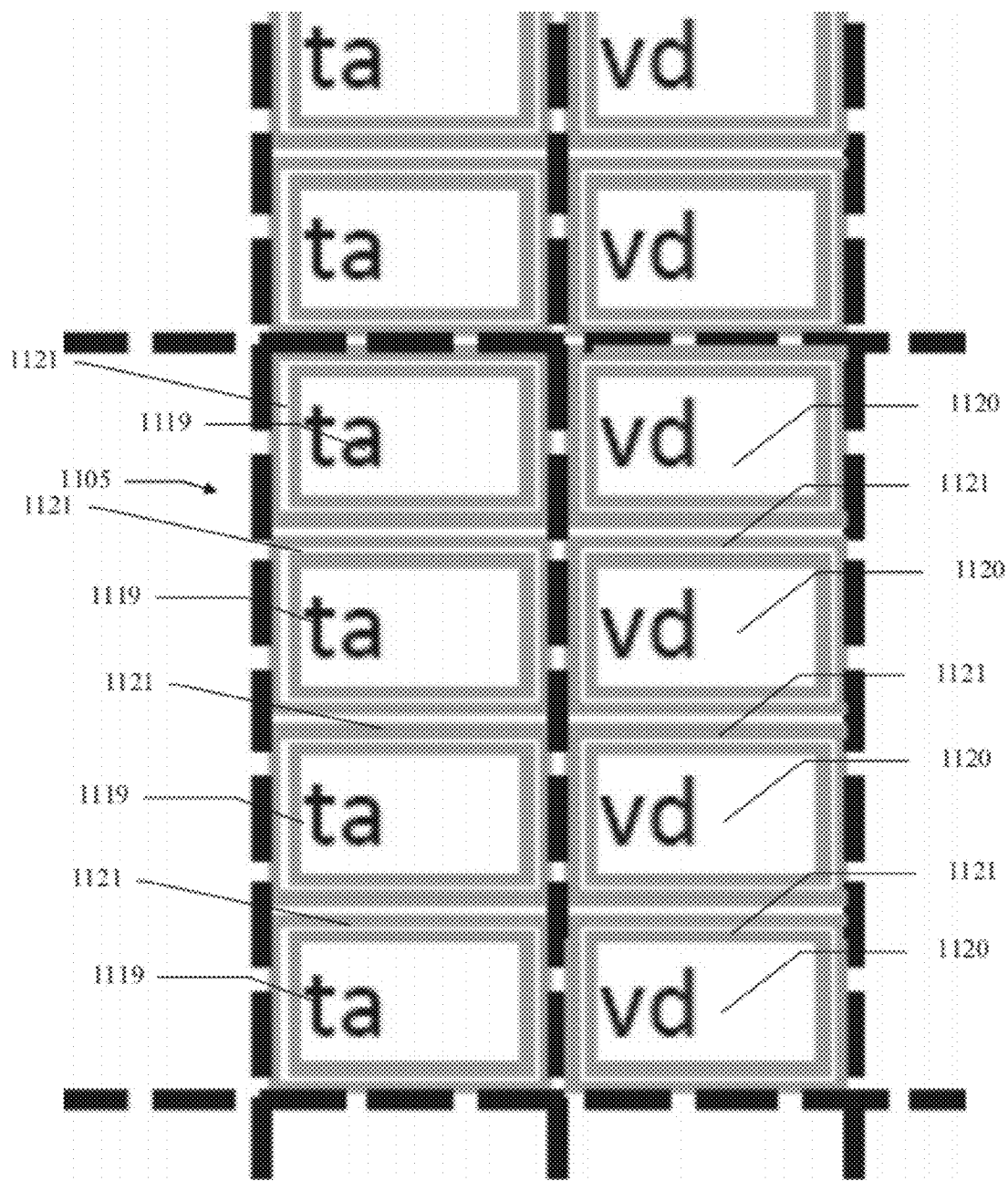

FIG. 11 shows a part of a wafer layout. The abbreviations vd=VCSEL Driver (i.e. integrated circuit with driver circuits) and ta=transimpedance amplifier (i.e. an integrated circuit with receiver circuits). FIG. 11b shows a zoomed section of the wafer of FIG. 11.

Figure 12:
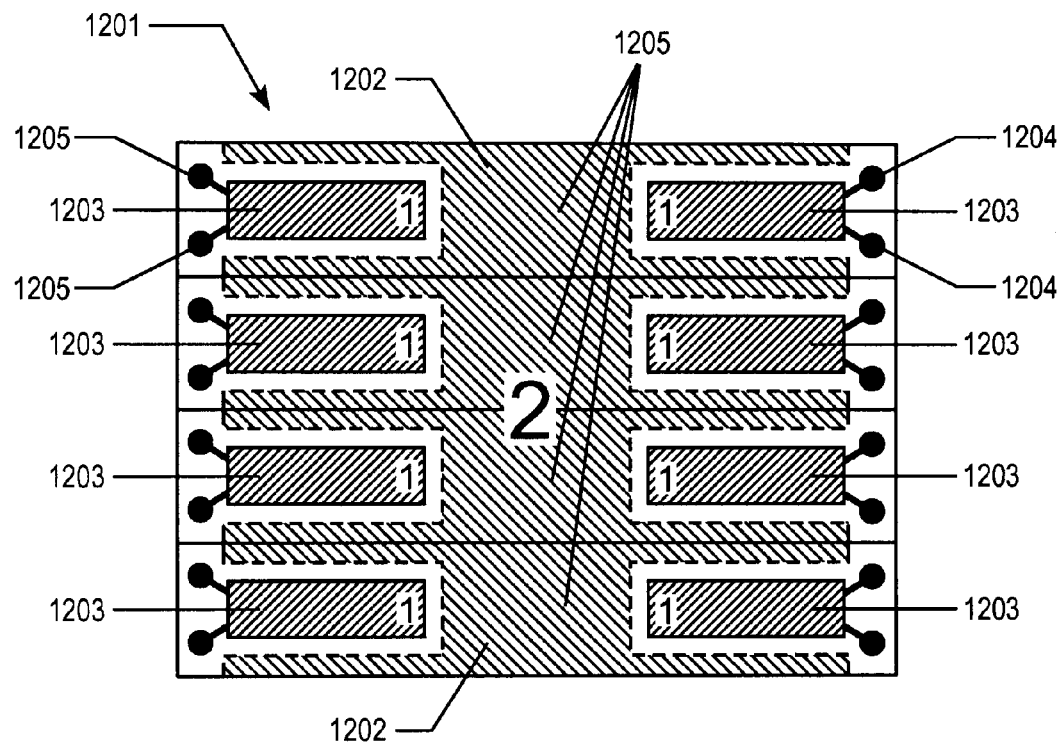

FIG. 12 shows an integrated circuit with 4 channels such as those of FIGS. 5 and 7.

Figure 13:
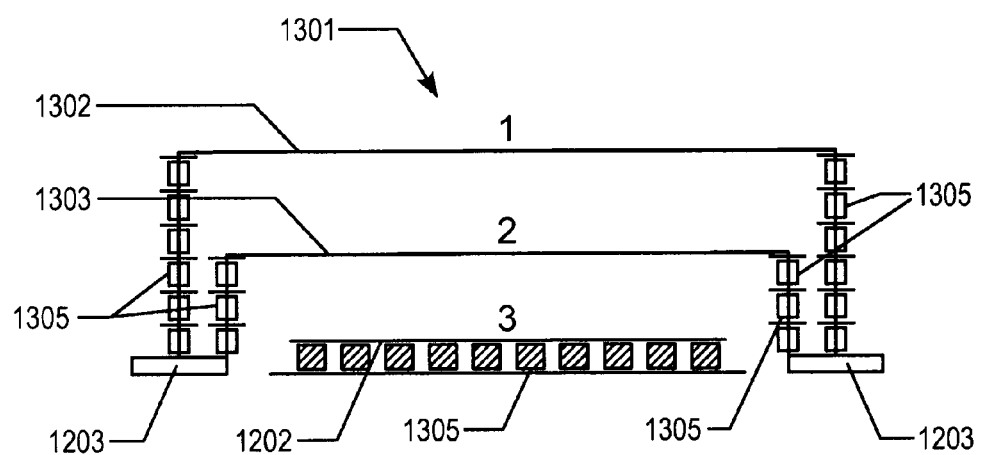

FIG. 13 shows a sketch of a cross section of the integrated circuit of FIG. 12.

Figure 14:
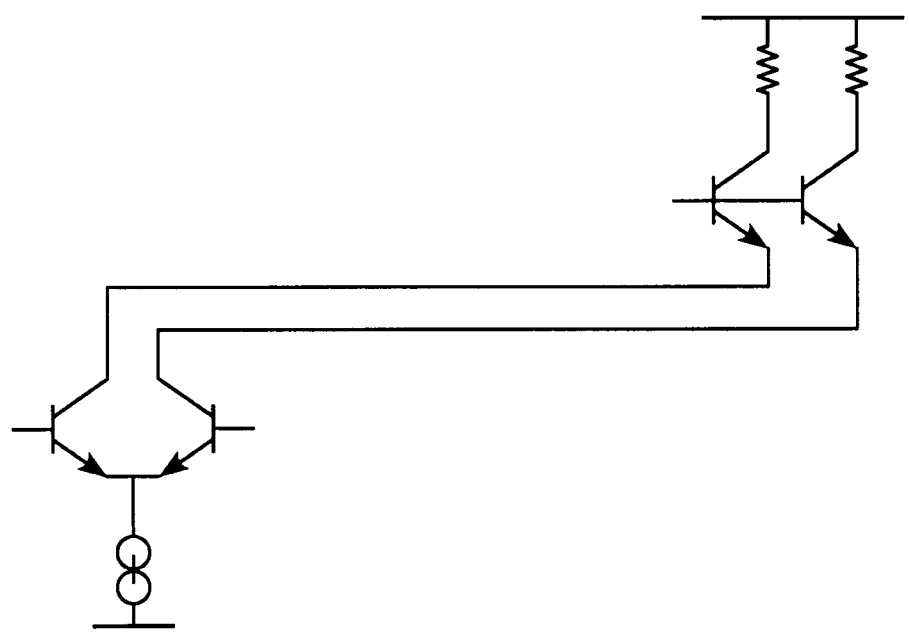

FIG. 14 shows a sketch of a circuit suitable for routing the high speed channels over relatively long distances.

FIG. 15a-d shows 6 integrated circuits 1501 on a wafer as well as features related to the addressing of the circuits as well some of the connection which may be made once the chip is mounted. A thick line 1511 surrounding circuits number 4 and 5 (seen from the left side) indicates that these circuits are comprised on the same chip once divided from the wafer.

FIG. 16 a-d shows various placements of chip, circuits, connection pads and arrays and the measurement of their widths.

When applicable these drawings show embodiments where the integrated circuits comprises M=4 channels and the width of the integrated circuit is 900 μm and d=100 μm so that their sum equals the length of an array of 4 optoelectronic devices (corresponding to 4 channels) at pitch 250 μm. As explained above this correspondence may preferable because a chip with M×4 channels will have a width approximately corresponding to length of the array minus d=100 μm As demonstrated in FIGS. 6 and 8-10, these embodiments of the invention provides the desired flexibility while allowing short connections between chip and optoelectronic devices. This often of importance particular at high data rates. We sometimes use the term "device" as reference to the one of said M≥1 integrated circuits, but we mainly use the term "intergrated circuit" to distinguish from e.g. "optical device".

As mentioned above, these integrated circuits are in one embodiment sawed from a wafer so that in one embodiment the invention relates to a method of producing a chip according to the invention as described above comprising a number of said integrated circuits on a wafer each circuit comprising N channel-circuits each having a circumscribed rectangle spaced apart at least by a distance d and cutting from said wafer a chip comprising two of more of said integrated circuits and thereby obtaining a chip having the combined set of channels from each of said integrated circuits.

In most embodiments illustrated in the figures shows 4 channel integrated circuit each integrated circuit has N=4 channels as an example. As explained elsewhere the integrated circuit may comprise any number of channels. For the case of an integrated circuit with 4 channels M=4 integrated circuits can be divided into a chip to obtain a 16 channel chip. The width (i.e. device side) of each integrated circuit is in one embodiment less than 4×250 μm (see FIG. 5) which is a common fiber spacing. The fiber spacing commonly dictates the pitch of the optoelectronic devices in arrays (such as laser diodes or photodiodes) so that a fiber bundle can easily be connected to the array.

Examples of embodiments of the invention are provided in FIGS. 5-10. FIGS. 5 and 7 show exemplary floor plans (i.e. outline and pad layout) for a transmitter integrated circuit and receiver integrated circuit, respectively. FIGS. 6 and 8-10 show and overview drawings of the chips according to embodiments of the invention connected to the array of optoelectronics integrated circuits (VCSELs and photo diodes). The drawing show part of the layout of the board suitable for mounting of the chip and array as well as an outline of the chips, their pads and the array of optoelectronic devices.

Figure 1:
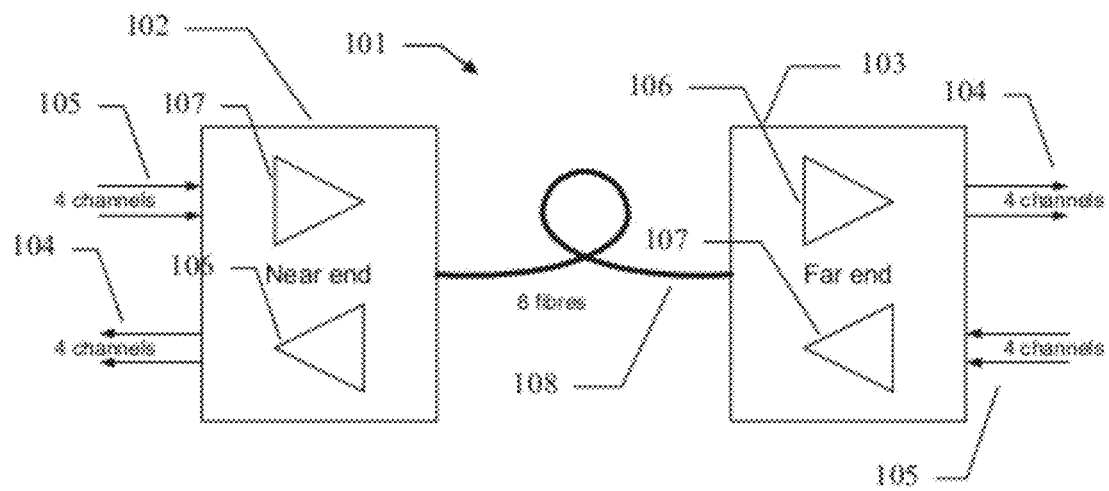
FIG. 1 shows an optical link with 4 channels in each direction

FIG. 1 illustrates an optical link 101 with a near end module 102 and a far end module 103. Each end has a receiver 106 and transmitter 107 with 4 channels and the optical signal is carried by 8 optical fibers 108. The interface to the remaining electrical system in each end is carried out by 4 electrical inputs 105 and 4 electrical outputs 104.

Figure 3:
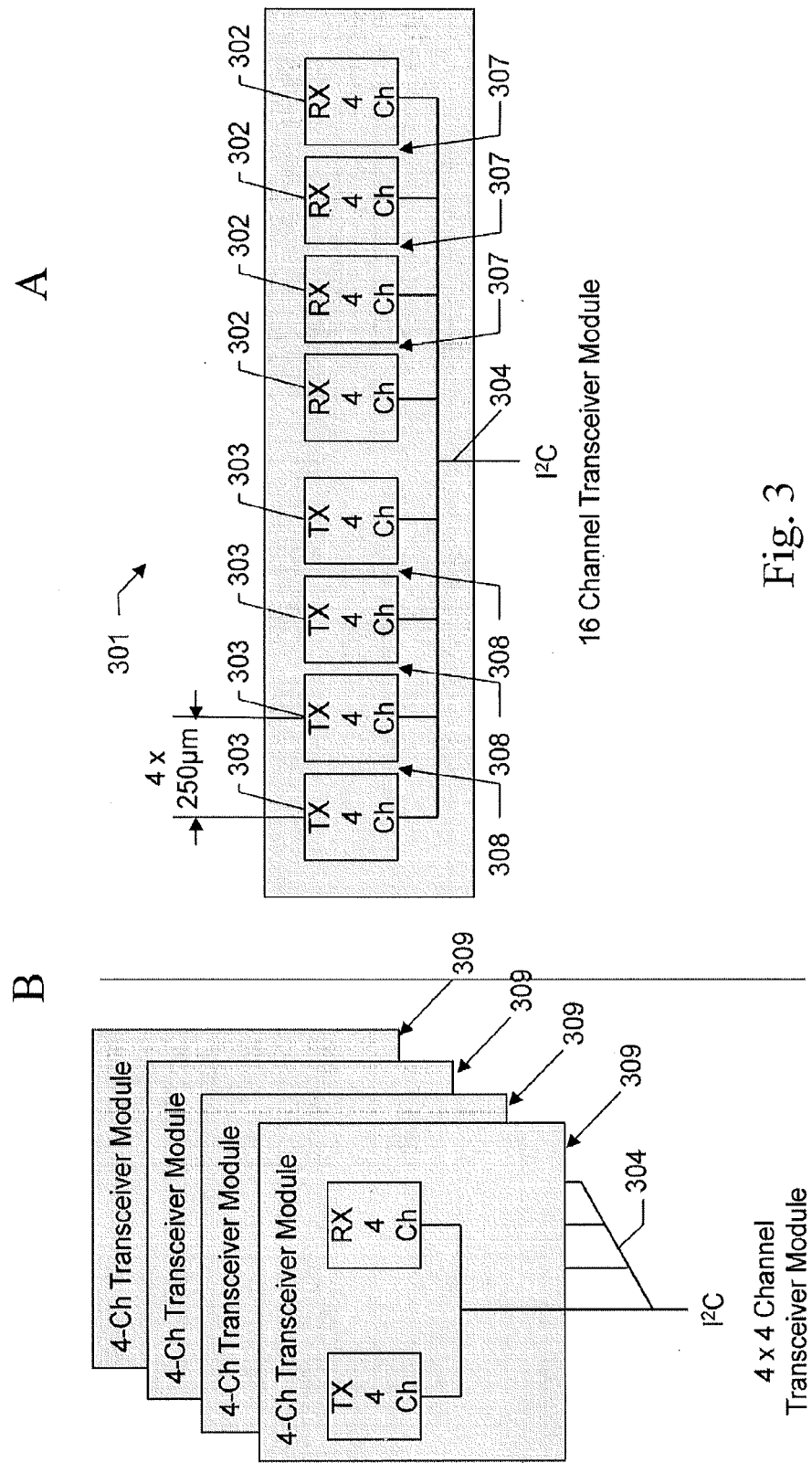
FIG. 3 shows 2 examples of modules with 16 channels using a shared I2C.

FIG. 3 shows to examples of an optical transceiver module with 16 channels (the optoelectronic components are not shown). In example A the module comprises a receiver chip comprising 4 4-channel receiver circuits 302 (such as TIA, TIA+LIA, TIALA circuits) and a transmitter chip comprising 4 4-channel transmitter circuits 303 (i.e. driver circuits for the light sources of the module). The chips are separated by the spacing 306 and the integrated circuits of each chip are separated by a spacing d 307,308 which need not necessarily be identical for the two chips. The integrated circuits are in this embodiment spaced apart with a pitch of 4×250 μm which may match an array of optoelectronic devices having a pitch of 250 μm. A common I2C interface connects the integrated circuits of the two chips. In example B 4 separate transceiver modules 309 each with a 4 receiver and a 4 channel transmitter chip are applied to achieve the same number of channels. Each chip is connected to a 4 channel array of optoelectronic devices because it may be difficult to place separate chips sufficiently close to be connected to the same array with sufficiently short connection. Example B will in most case take up significantly more space when mounted which is often a significant disadvantage in practical applications.

FIG. 5 shows an exemplary floor plan of a transmitter integrated circuit 501 (here a VCSEL driver) i.e. an integrated light source driver circuit with N=4 channels 502 laid out in the horizontal direction. The outer boundaries with dimensions 1000 μm by 900 μm define the circumscribed rectangle. Any guard ring is not shown. The device side 503 is the right hand side of the rectangle. The connection pads (DOx and GND) are aligned along the connection side 503. The data pads for a differential input (DIx, DINx) are aligned along the opposite side 504. Pin assignment (i.e. assignment of DI1, SCL etc.) is found in table 3. Placing the channel-circuits along a direction perpendicular to the device side so these circuits transforms the digital signal input on one side to the connection pads on the opposite site is a general principle which may be applied any of the embodiments of the inventions unless otherwise clear.

FIG. 6 shows the integrated circuit 601, 602 applied as two integrated circuits VD1 and VD2 on a single chip. The circuits are spaced apart by the spacing d 603 and both circuits form a single chip (outline not shown). The thick black lines (such as 610) are traces on the substrate board layout on which the chip is mounted and the larger black dots (such as 605-608) indicate VIAs on the substrate board. The board provides connections to the data pads (DIx, DINx) where only the end of the lanes carrying high speed data signal are shown. The board also provides connections 611 to the array of light sources (such as VCSELs) 604. In this case the array is a 1×8 VCSEL array on 250 μm pitch. VD 1 and VD 2 refers to VCSEL driver integrated circuit 1 and 2, respectively, each comprising 4 channels. The traces running vertically provide power supply (VDD, VDD2, GND) as well as connection to the digital interface of the circuits (SCL=clock and SDA). Note that when the chip is mounted SCL is routed via VD 2 to VD 1. This is done to allow room for the VDD2 connection. SDA is routed similarly. The circles 612 encircles hardwired address pins AD0 and AD1 which are incorporated with pull down on in the integrated circuit so not routing to these pins corresponds to logic low. The 4 different options of routing or non-routing to the AD0 and AD1 chips allow for a chip-unique address for a chip with up to four integrated circuits similarly to a 2-digit binary number.

FIG. 7 show an exemplary floor plan of a receiver integrated circuit i.e. a receiver circuit with N=4 channels 702 laid out in the horizontal direction. The outer boundaries with dimensions 1000 μm by 900 μm define the circumscribed rectangle. Any guard ring is not shown. The device side 703 is the right hand side of the rectangle. Pin assignment (i.e. assignment of DO1, SCL etc.) is found in table 4. The connection pads (DIx and VBx) are aligned along the connection side 703. The data pads for a differential output (DOx, DONx) are aligned along the opposite side 704. Placing the channel-circuits along a direction perpendicular to the device side so these circuits transforms the detected signal input to the connection pads on one side to the output on the opposite site is a general principle which may be applied any of the embodiments of the inventions unless otherwise clear.

FIG. 8 shows the integrated circuit 701 applied as applied as integrated circuits 802 on a single chip (chip outline is not shown) as well as the traces (connections) on a board for mounting the chip and the array of photodiodes 804, similar to the driver chip and board of FIG. 6. The array of optoelectronic devices 804 is a 1×8 photodiode array with 250 μm pitch. TIA 1 and TIA 2 refers to receiver integrated circuit 1 and 2, respectively, each comprising 4 channels (see FIG. 7). In this example and the examples of FIGS. 5-7 it is noted that the routing between integrated circuits is located on the board on which the chip is to be mounted. The circuits are spaced apart by the spacing d 803. The thick black lines (such as 810) are traces of the exemplary substrate board layout on which the chip is mounted and the larger black dots (such as 805-808) indicate VIAs on the substrate board. The board provides connections to the data pads (DOx, DONx) where only the end of the lanes carrying high speed data signal from the receiver chip are shown. The board also provides connections 811 to the array of light photodiodes 804. The traces running vertically as well as the addressing via AD0, AD1 are similar to those of FIG. 6.

In one embodiment two integrated circuits for FIGS. 6 and 8 has been separated at the spacing 603, 803 which may be preferred in embodiments where the integrated circuits has already been separated for other reasons or where it is e.g. preferred to saw out all integrated circuits from the wafer. By using suitable size constraints it may still be possible to use the sawed out integrated circuits in a modular form to connect to a single array as shown here. However, often the integrated circuits of a chip are spaced closer than possible when the circuits have been separated into individual chips.

In one embodiment it is necessary to adhere to design rules such as rules dictating that connections may not cut when the wafer is sawed into chips. In some embodiment of the invention guard rings substantially surrounds each of M integrated circuits. A common design rule is not to have connections on the wafer traversing the guard ring. However, in one embodiment the integrated circuits are connected via at least one connection on the chip, such as a connection traversing one or more guard rings. Such an embodiment is shown in FIG. 9. The circuits and board of FIG. 9 are similar to those of FIG. 8 but illustrates an embodiment where the circuits are connected across the seal ring via the connections 902 across the separation 803. At the top and bottom of the chip 905, the wires are cut. The chip in one embodiment comprises circuitry for sufficient isolation with or without supplied power indicated by the dots 903. Furthermore, an on-chip connection between the integrated circuits is provided for routing SCL, which, compared to FIG. 8, makes the "OPT1" available for other uses. It is clear that other connections may be routed in a similar manner and that this method may be applied on transmitter and transceiver chips as well. In one embodiment the addressing via AD0, AD1 no longer required because the chip may determine its address based on whether the wires are cut (see FIG. 15d and the corresponding discussion).

Figure 16A:
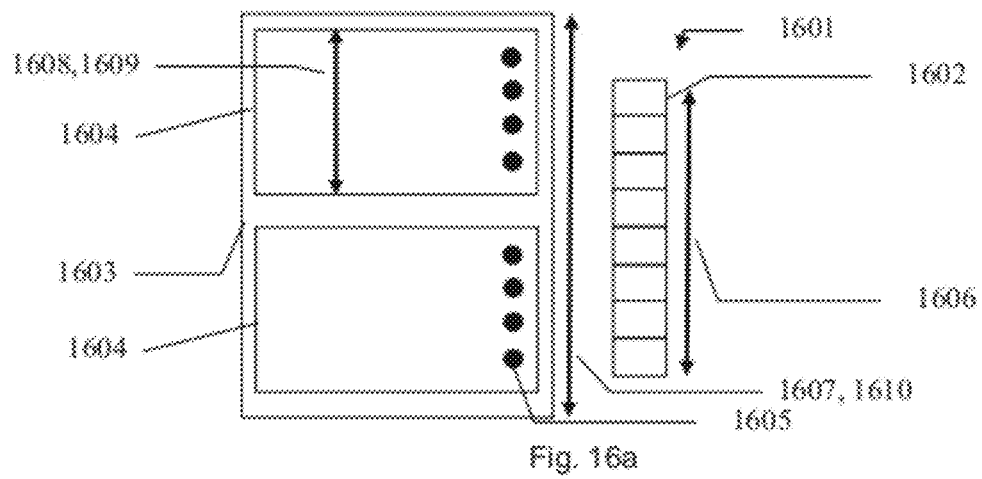
Figure 16B:
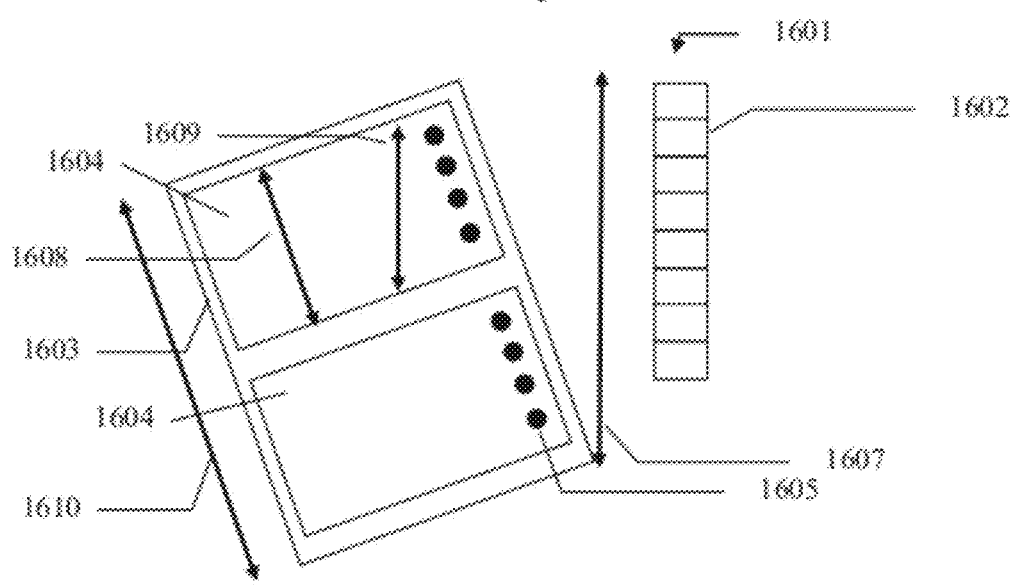

FIG. 10 shows a schematic cross sectional view 1001 of a mounted chip 1002 on the board 1009 shown in FIGS. 6, 8 and 9. The seal ring 1003 and the optional connections through the seal of FIG. 9 1007 are indicated along with the VIAs 1006. The chip 1002 and the array 1004 are both flip-chip mounted onto the substrate via bumps 1005. The traces and lanes on the board 1008 are also indicated corresponding to the thick lines in FIGS. 6, 8 and 9. FIG. 16 a-d shows various placements 1601 of chip 1603, circuit 1604 connection pads 1605 and an array 1602 and the measurement of their widths. The chip 1603 comprises two circuits 1604 each comprising for 4 channels with 4 connection pads 1605. The array 1602 comprises 8 optoelectronic components and has the width indicated by 1606. In FIG. 16a the array and chip are placed relative each other similarly to FIGS. 6, 8 and 9. The width of each circuit is measured parallel to the width of array 1608 (or parallel to the array for short) and parallel to the device side (the right side) along which the connector pads are arranged. The width of the chip 1606 is measured parallel to the width of the circuits. In one embodiment the width is measured along the direction of the array (1×2) of circuits which in FIG. 16a is identical to the first cited width measurement. This measurement of the width may apply to any embodiments of the chip, integrated circuit or the system discussed throughout this text. The direction of the array is taken to mean the direction along which the high number of the matrix is arranged. In FIG. 16b the chip is placed skewed relative to the array which in most cases will provide for a longer maximum length of a connection to the optoelectronic components. The widths of the circuit and chip is in one embodiment measure parallel to the array (1609, 1607), but in a preferred embodiment the width is measured parallel to the array of the circuits 1606, 1608. In this embodiment the chip is clearly arranged to be placed as in FIG. 16a as this reduces the maximum length of the connection to array.

Figure 16C:
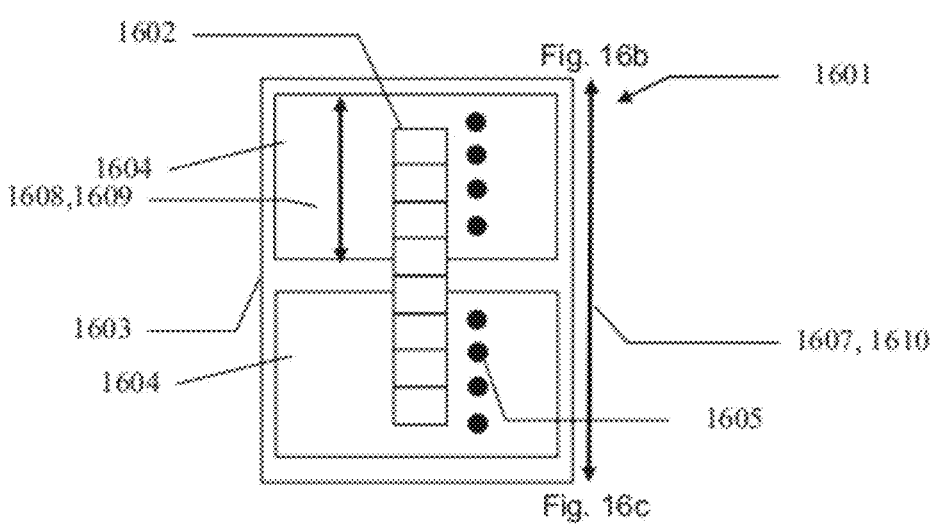

In FIG. 16c the optoelectronic component 1602 are mounted on top of the chip 1603. In the case the width are measured similarly to FIG. 16a.

Figure 16D:
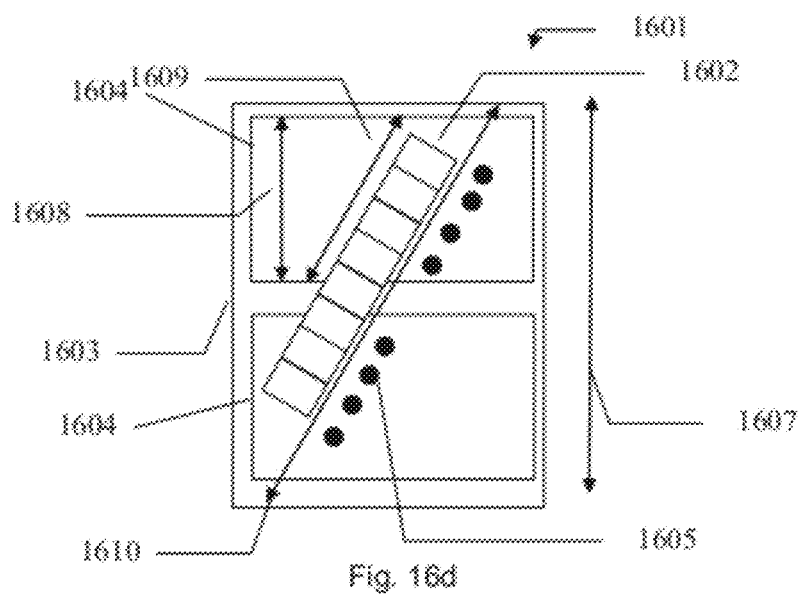

In FIG. 16d the optoelectronics are mounted askew on top of the chip and the connection pads are arranged to provide the shortest connection with this mounting. Here the width may be measure in two ways similarly to FIG. 16b.

Wafer Layout

FIG. 5 shows a part of a wafer layout. FIG. 11b shows a zoomed section of the wafer of FIG. 11. The abbreviations vd=VCSEL Driver (i.e. integrated circuit with driver circuits) 1119 and ta=transimpedance amplifier (i.e. a integrated circuit with receiver circuits) 1120. The seal rings 1121 are indicated surrounding each integrated circuit. The saw patterns 1110-1117 are shown as thick dashed lines. As indicated several configurations are available from the wafer, i.e. a driver chip or receiver chip with a single circuit (1102 and 1106, respectively), with two circuits (1103 and 1107 respectively), with three circuits (1104 and 1108 respectively) and with four circuits (1105 and 1109, respectively). It is noted that omission of the saw line 1116 results in transceiver chips comprising an equal number of transmitter and receiver circuits. In one embodiment the optoelectronic components may be placed on either side of the transceiver chip, i.e. detectors next to the receiver circuits and light sources next to the driver circuits. In one embodiment the optoelectronic components may be mounted on top of the chip.

As noted, FIG. 11 shows a subsection of a wafer comprising integrated circuits according to one embodiment of the invention along with exemplary saw lines suitable for cutting chips with a varied number of channels from the wafer. In the following, the optical device side refers to the side of the Driver intended for interconnection to the light source as well as the side of the Receiver intended for interconnection to the photo detector.

Many patterns for laying the integrated circuits on the wafer are possible. For example the wafer may be transmitters only or receivers only. It may also be possible to design transceiver chips where chips are sawn from the wafer comprising receiver and transmitter integrated circuits. In one such embodiment the device side of the receiver and transmitter integrated circuits are arranged along the same line so that on the wafer the integrated circuit are placed alternating in rows parallel with the device side (in FIG. 11 this direction would be vertical). In another embodiment the device side of the receiver and transmitter integrated circuits are arranged on opposite sides and each row is either transmitter or receiver integrated circuits. In this way transceiver chips may be formed by sawing a number of integrated circuits from a row of transmitters along with a number of integrated circuits from a row of receivers. The device side for connecting to light source may then be on opposite side from the device side for connecting to photo diodes.

In one embodiment the yield of a wafer may be increased by not including faulty integrated circuits in chips with multiple integrated circuits. In one embodiment this requires sawing in other patterns than straight lines such as in steps. In one embodiment this is carried out using a laser cutting technique.

Room for Auxiliary Circuitry

FIGS. 12-13 show on example of how the auxiliary circuitry may be fitted in the integrated circuit while providing an integrated circuit which is sufficiently short along the device side according to one embodiment of the invention. In this example the high speed channel is routed above the auxiliary circuitry. As an example a cascode construction 1401 is shown suitable for providing a low impedance net over which the signals may be transmitted over relatively long distances. More specifically FIG. 6 shows an integrated circuit 1201 with 4 channels such as those of FIGS. 5 and 7. The area marked by 1 and 1203 are used for the high speed channel whereas the area 2, 1202 is used for auxiliary circuitry. Such auxiliary circuitry often comprises control circuitry suitable for adjusting the performance of the channel circuit. It may also comprise current references and thermometers or the like. The areas marked by 1, 1203 may be connected using the approach and circuitry shown in FIGS. 13 and 14. Similarly to FIGS. 5 and 7 the connection pads 1204 are aligned along the device side and the data pads 1205 are aligned along the opposite side.

FIG. 7 shows a sketch of a cross section 1301 of the integrated circuit of FIG. 12. The high speed channel circuitry resides in the layer 1203 and is routed via the connection 1, 1302 over the auxiliary circuitry which is located in the area 3, 1202. In between is located a ground plane 2, 1303 for isolation. The sketch shows VIAs 1305 running through the layers of the chip substrate. FIG. 8 shows a sketch of a circuit suitable for routing the high speed channels over relatively long distances. The cascade creates a low impedance net that is suitable for transmission of the relatively long distance.

Signal Quality Monitor

In one embodiment the integrated circuit periodically monitors the signal quality of the Channels.

In one embodiment this is done by comparing the main signal, which is quantified in the limiting amplifier having a threshold in the middle between the low and high levels of the signal, with a test signal which is quantified in a limiting amplifier having an offset from the middle.

If e.g. the offset used for quantizing the test signal is at 0.5 times the amplitude of the signal this corresponds to having a signal with 3 dB less input power.

By measuring the number of incidences where the main signal is different from the test signal it is possible to estimate the BER assuming a 3 dB worse input level. If e.g. 1 incidence is measured in 40 µs then this corresponds to a BER of 1e-6. Assuming the typical Erf functions this estimates the actual BER to be less than 1e-20.

In order to reduce the power consumption the signal quality monitor is in one embodiment turned off most of the time. In one embodiment the period for monitoring the signal quality can be controlled from the management interface. In one embodiment the default is that the signal quality is monitored once every 1/10000 s or longer, such as once every 1/1000 or longer, such as once every 1/100 s or longer, such as once every 1/10 s or longer, such as once every 1/5 s or longer, such as once every 1/2 s or longer, such as once every 1 s or longer, such as once every 10 s or longer.

Figure 2:
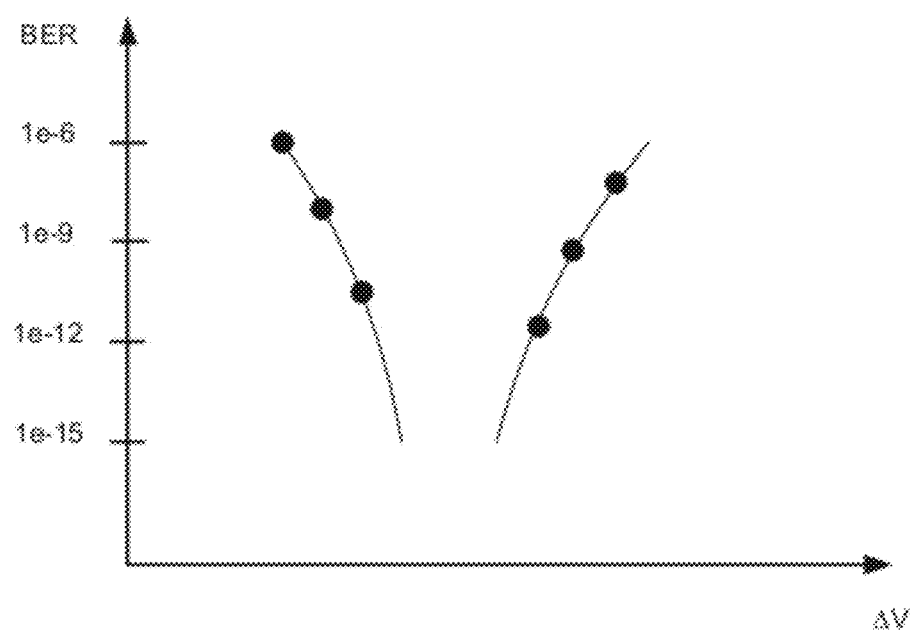
FIG. 2 shows Bath tub curve drawn based on measured error incidences (BER levels) as a function of decision threshold voltage.

In one embodiment, in addition to controlling the monitoring period it is also possible to control the quantization level of the test signal. If the number of error incidences is monitored for different quantization levels it is possible to make an estimation of the actual BER. This corresponds to making the classical bath tub curve (see FIG. 2).

In one embodiment the signal quality is monitored on an active channel transmitting data. Channels that are squelched or off cannot be monitored.

In one embodiment the signal monitor cannot extract the exact bit error rate but maybe used to monitor whether the link is operating satisfactory or not. So if e.g. a BER of 10-12 is estimated this may be an adequate level if e.g. Forward Error Correction is applied but may not be acceptable for a pure data link without any error correction.

Programming the Integrated Circuit

Figure 4:
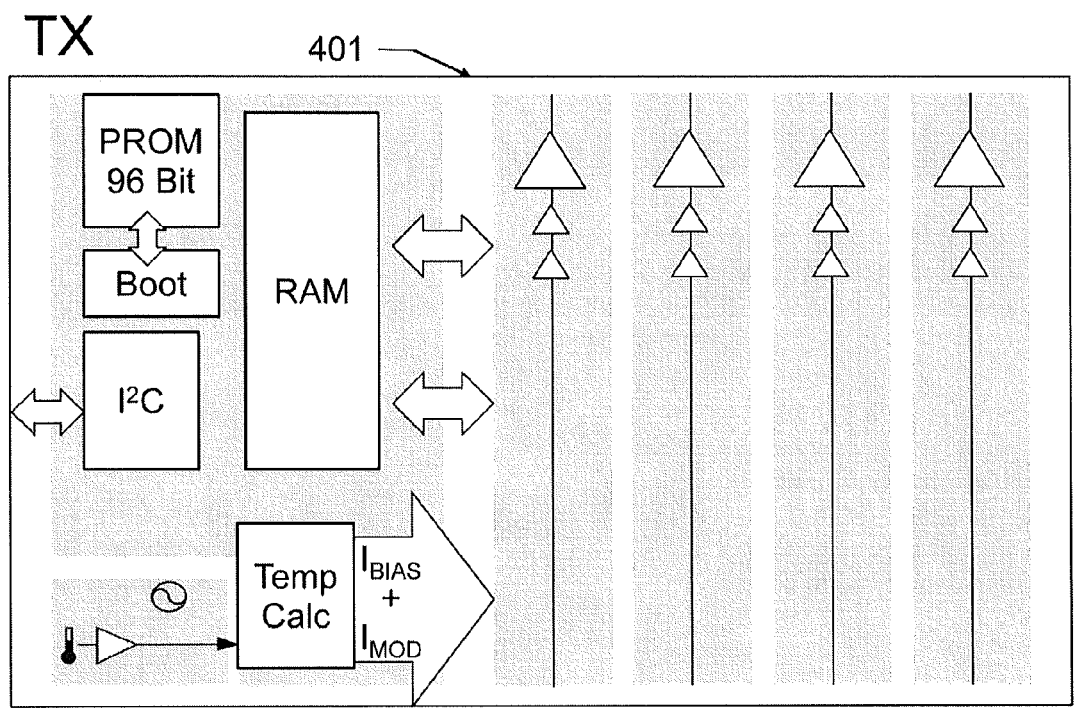
FIG. 4 shows a memory mapping and management application diagram example.

In one embodiment the chipset features a PROM which is used to store different options for the module during manufacturing (see e.g. FIG. 4). E.g. the I/O configuration is stored in the PROM.

In one embodiment the chipset is self-configurable at power on. In one embodiment the chipset does not require any external programming but optionally this is possible via a digital interface such as an $I^2C$ interface or any of the other interfaces discussed below. In one embodiment the interface may be used in a debug phase or during testing to find the optimum settings during production.

In one embodiment the optical interface, i.e., the part of the digital interface for adjusting the operating parameters for the optoelectronic components, is not exposed on the transceiver module and all optical settings are stored in the PROM during manufacturing such as during testing.

In one embodiment the system master use an $I^2C$ bus to interface to the module. As it will be clear to a skilled person other methods known in the art which to communicate with multiple integrated circuits may also be applicable.

In one embodiment the integrated circuits are manufactured as 4 channel (other configurations may also be used such as 1, 2, 3, 4, 5, 6, 7, 8, 9, 10, 12 or more channels per integrated circuit), but any number of integrated circuits may be placed in parallel, making individual addressing of each integrated circuit a challenge.

In one embodiment the integrated circuit will implement one or more addressing functions that allow the user to access each integrated circuit individually.

However, in many embodiments the area of the individual integrated circuit will be relatively small in which it may be a challenge to have sufficient area for the pads required to connect to the chip. At the same time the interface to the each integrated circuit should be flexible so that each integrated circuit is addressable regardless of whether it is alone on the chip or part of an array of devices. Exemplary embodiments are discussed below.

Figure 15A:
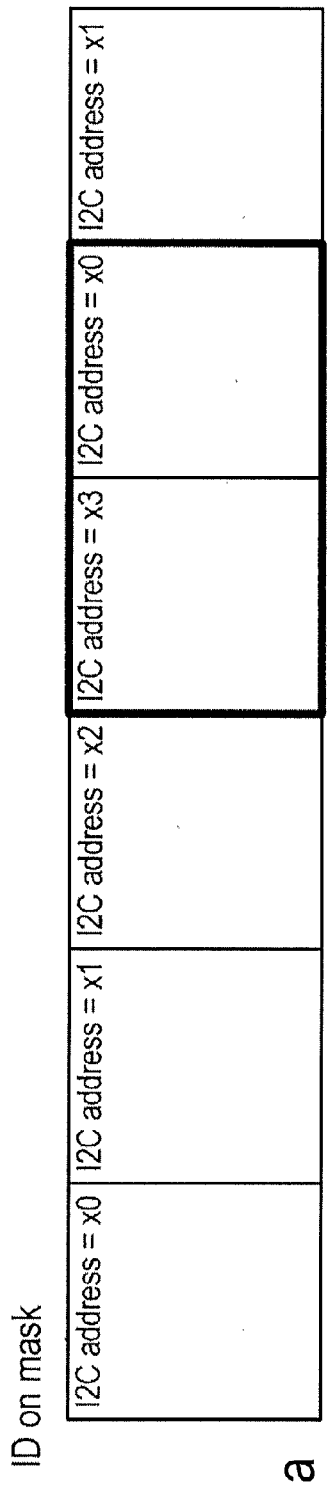
Figure 15B:
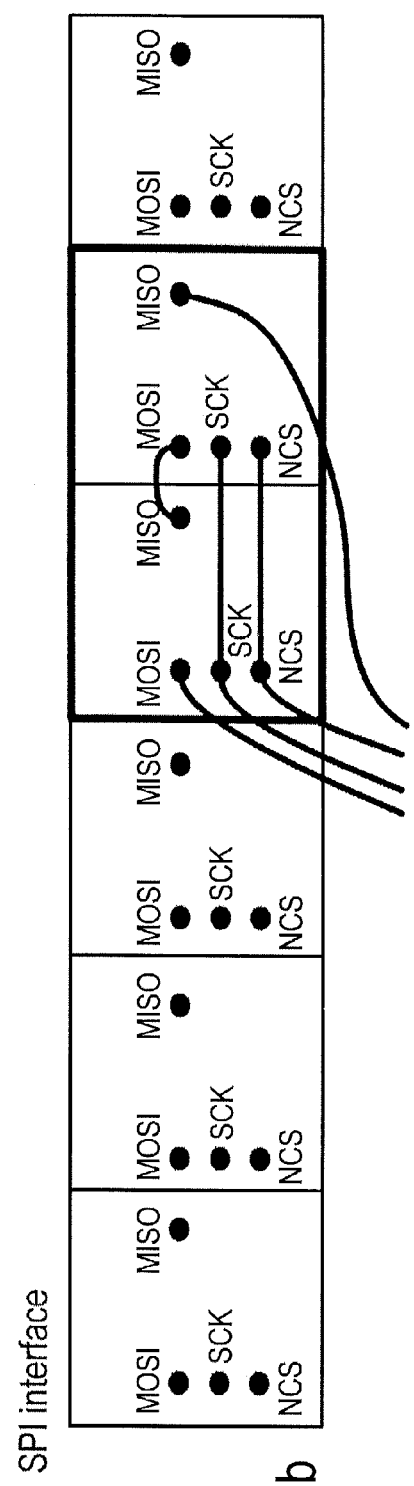

In one embodiment one or more inputs of the digital interface is common between the integrated circuits of the chip, such as e.g. a clock signal. In one embodiment all of the inputs are shared. In one embodiment the integrated circuit comprises and input and output for daisy chaining one or more of said inputs between two or more integrated circuits. Examples of such daisy chaining are shown in FIG. 6 where the data connection (SDA) and the clock (SCL) are routed between circuits VD1 and VD2. See also FIG. 15*b* where MISO 1503 and MOSI 1504 in an SPI interface are daisy chained and FIG. 15*c* where SDA$_I$ 1508 and SDA$_O$ 1509 allow daisy chaining. In FIG. 15*b* the integrated circuits 1512 comprises an SPI interface which may be connected in standard daisy chained configuration where the integrated circuits on the chip are corporative slaves. The standard inputs are MOSI 1504, MISO 1503, SCK 1503 and NCS 1506. The connections are made on the board as indicated by the leads 1502, where the loose ends of the leads are wired to a controller (master). In one embodiment the integrated circuit is alone on the chip and in one embodiment the chip further comprises neighboring integrated circuits. Accordingly, in one embodiment said integrated circuit comprises a digital interface having an input arranged to be daisy chained to the input of a digital interface of said optional integrated circuit.

As discussed above, in embodiments the circuit is arranged to allow addressing of said circuit on said digital interface relative to an optional neighboring integrated circuit on said chip. This is often practical in embodiment where the digital interfaces of the integrated circuits are shared.

In one embodiment the circuit comprises a non-volatile ID number arranged to function as a chip-unique address. When a controller (also referred to as master in the art) communicating via a bus connected to the digital interfaces of the integrated circuit utilizes the chip-unique address as a part of the communication (e.g. following commonly used interface standards such as SPI and I2C) the address allows the master to direct the instructions to a specific integrated circuit. In one embodiment the non-volatile ID number is provided on the wafer such as via the mask layout applied to define the circuitry on the wafer, i.e. as part of the production of the wafer and before formation of the chip. An example is shown in FIG. 15*a*: the integrated circuits are provided with consecutive addresses on the wafer (. Any subsection divided from the wafer will allow identification of the relative position of one integrated circuit relative to the others. In the example of FIG. 15a the non-volatile ID number can take the values from x0 to x3 allowing chips comprising 1, 2, 3, or 4 integrated circuits while still having chip-unique addresses, and the relative location can be determined based on the addresses of the chip. For instance a master communicating with a chip comprising 3 integrated circuits with addresses x0, x2, x3 may be programmed to conclude that the physical sequence of the circuits are x2, x3 and x0 based on knowledge of the original sequence on the wafer. As discussed further below, the system comprises firmware which contain a discovery algorithm, since a device holding several dies, may have one of several combinations addresses. In one embodiment the addresses are I2C addresses.

Alternatively, the non-volatile addresses may be provided to the circuit after production (i.e. subsequent to formation of said chip) for example as part of a test procedure where data may be stored in the circuit. In one embodiment any of the methods of providing an address to the chip described may be applied to assign a non-volatile address.

In one embodiment the address may be assign using an activation pin individually connected to the controller. This is discussed further in the section "Usage cases; Common I/O line". The controller applies the activation pin (e.g. a chip-select (CS) or an "Anamux" pin which a chip select pin which may have other functions depending on the mode of the circuit) to indicate which integrated circuit communication is directed. In one embodiment this activation pin is applied as such in order for the controller to provide an address to the circuit after which the pin assumes a different function, such as e.g. RSSI indicator in a receiver chip. This approach has the advantage of conserving pads on the circuit and chip.

In one embodiment the circuit arranged comprises pads arranged to receive chip-unique address from a circuit board (see e.g. FIGS. 6 and 8) on which the chip is to be mounted for example as logic states applied to one or more pads arranged to form an ID. The approach using hardwired addresses are further discussed in the section "Approach using hardwired addresses" below.

Figure 15C:
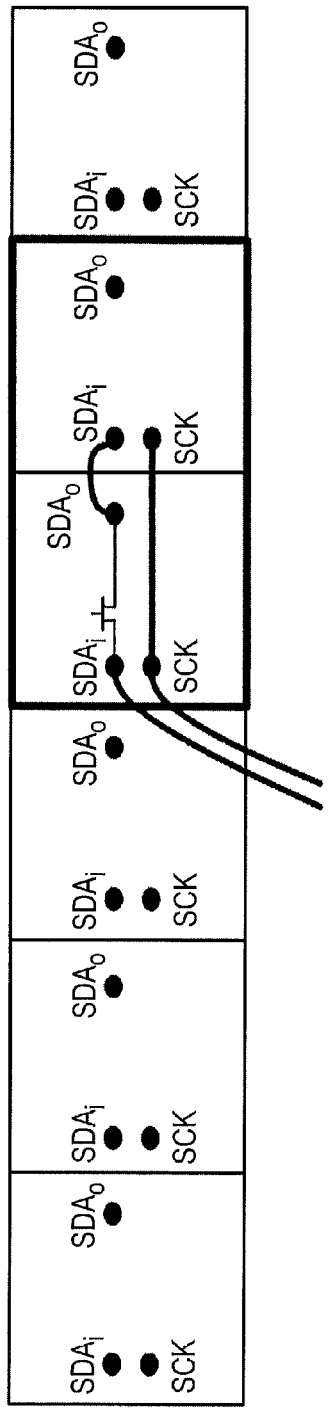

In one embodiment the integrated circuit is arranged to assume a default address unless another address has been assigned. In one embodiment the circuit comprises a pass gate connected to the input of the next integrated circuit in case it is present. In one embodiment the gate is closed when the integrated has not been assigned an address and opens when a chip-unique address has been assigned. In this way the controller may assign an address to the next integrated circuit for example by communicating with next integrated circuit via the default address. This principle is illustrated in FIG. 15c where the integrated circuit 1512 comprises an I2C interface where the pass gate 1510 is used as part of the addressing procedure. Although not shown all integrated circuits of the wafer comprises a pass gate 1510. The I2C inputs $SDA_I$ 1508 and $SDA_O$ 1509 are arranged to allow daisy chaining of the SDA wire of the I2C interface routed as part of the integrated circuit. As with the example of FIG. 15b the connections to the inputs of the interface are exemplified by the leads 1502. In one embodiment the integrated circuit comprises a pass gate arranged to allow access to the input of a digital interface of said optional integrated circuit once a chip-unique address has been assigned to the integrated circuit. In one embodiment said integrated circuit and said optional integrated circuit are arranged to have a default address before said assignment of a chip-unique address. Via the sequential addressing the controller may obtain the order of the integrated circuits.

Figure 15D:
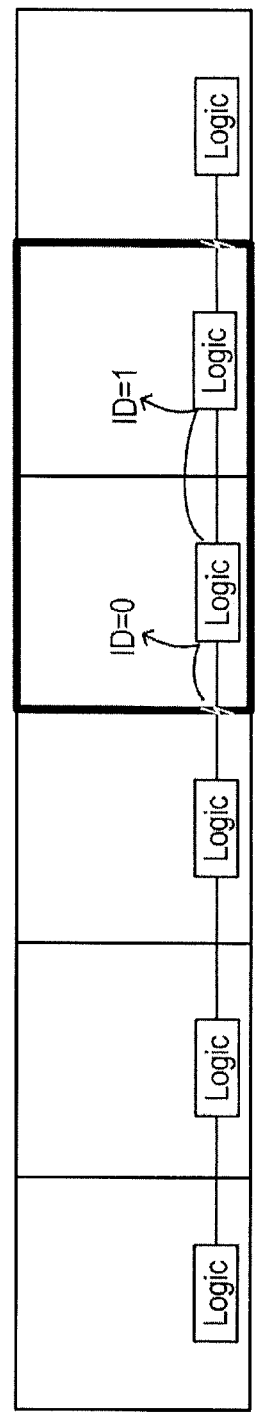

In one embodiment the integrated circuit comprises a connection to said optional neighboring circuit which is arranged to allow detection of the presence of said neighboring circuit on said chip, such as a connection through a seal ring around said integrated circuit. Such connections are illustrated in FIG. 9 and FIG. 15d. In one embodiment the circuit comprising logic 1510 arranged to determine a chip-unique address based on said connection. For example, similarly to the pass gate the first circuit may detect that connection on one side has been cut and responding by allowing an address to be assigned after which is open the connection to the a subsequent circuit (similarly to the connection being cut) causing the subsequent circuit (neighboring) to accept assignment of an address. Via the sequential assignment the controller may determine the order/location of the circuits on the chip.

In principle any suitable bus system may be applied such as e.g. I²C arranged with the integrated circuits as cooperative slaves (once addresses have been assigned). In one embodiment this only requires two pins per chip for the interface. I²C configured with independent (i.e. with a chip select function) slaves could also be applied which in one embodiment omits the need for addresses. In one embodiment SPI may be applied e.g. in Daisy-chain mode where the sequence of the chain may be applied to identify the location of the integrated circuits (see e.g. FIG. 15b).

Various embodiments of interfaces are further discussed in the examples provided in the sections below.

Fixed I²C Addresses

In one embodiment each integrated circuit will respond to two I2C addresses, one address is hardwired and is not changeable, this address can be used to broadcast to all integrated circuits on the bus. In one embodiment the address for the broadcast is selected to:

Tia: 0001100d
Driver: 0001101d

Here the 'd' denotes the Read/Write bit.

In one embodiment the user should be aware that the I²C bus, when used with several integrated circuits in parallel, will act as a wired AND if any of the integrated circuits on the bus can pull the bus low. In one embodiment a low 'ACK' is only an indication that one of the integrated circuits on the bus has acknowledged the transmission—not that all integrated circuits have acknowledged. Also if the broadcast address is used for reading, the bus will in one embodiment perform a wired AND on the data from each integrated circuit—effectively making the received data random.

Programmable I²C Address

In one embodiment the integrated circuit has a register holding its I²C address; this register can be written during normal operation, after writing the integrated circuit will respond to the new address.

In one embodiment, upon reset the default value of the register is set by the position on the wafer, the 'programming' of the default value is in one embodiment performed as part of the design. An example using the values from 0 to 3 are shown in FIG. 15a. In one embodiment the Address is selected such that the integrated circuits will be numbered from 0 to 7, repeated over the reticule. The default addresses are in one embodiment:

Tia: 1000xxxd
Driver: 1001xxxd

The 'xxx' denotes the default value programmed upon tape out, the "d" denotes the Read/Write bit.

Usage Cases; Separate I/O Lines

In this case each integrated circuit on the chip has a pin available for communication to the controller during start-up, this pin is in this text referred to as the "Anamux" pin or chip-select. In one embodiment an Anamux pin may perform other functions than chip-select when the integrated circuit is in another mode. In the present example the Anamux line is not connected in series or parallel to any of the other integrated circuits. I.e. a module controller or host device (master) will have an individual connection to the Anamux pin of each integrated circuit. This approach may be applicable if the implementation allows for a separate routing to the Anamux pin of each individual integrated circuit. In one embodiment the Anamux pin may be a multipurpose pin for example also arranged to provide error signals and/or a measure of received optical power (RSSI) or the like. In one embodiment the Anamux pin connects to a programmable I/O interface of the integrated circuit, such as an analogue multiplexer but the present invention is not limited to the use of an analogue multiplexer.

Addressing the integrated circuits can be done by performing a procedure in the firmware boot sequence. All commands are written to the integrated circuit broadcast address.

In one embodiment, for each integrated circuit, a unique $I^2C$ address is written to an $I^2C$ address register, with only the single integrated circuit selected through the Anamux.

After this procedure the $I^2C$ address of each integrated circuit is known. In one embodiment this procedure is independent of the default value of the $I^2C$ address register.

Usage Cases; Common I/O Line

This method approach may be applicable if the implementation does not allow for a separate Anamux routing to each individual integrated circuit.

The identification of each integrated circuit may in one embodiment rely on the default value of the $I^2C$ address register which in one embodiment is determined as part of the lay out on the wafer (see e.g. FIG. 15a), the address is hardwired into the integrated circuit see e.g. FIGS. 6 and 8, or a programmed into the integrated circuit e.g. during testing. In this case the firmware must in one embodiment perform a search for integrated circuits during boot up; to identify what integrated circuits exists on the bus. In one embodiment the available addresses of the integrated circuits on a chip are known to the controller/firmware at boot-up. If three integrated circuits are placed in parallel (such as on the same substrate) for a 12-channel solution the integrated circuits can be numbered 0, 1, 2 but any sequential combination can exist such 4, 5, 6 or 7, 0, 1. This approach is also applicable for other systems not using a common Anamux line.

In one embodiment the firmware can test for integrated circuits by writing the address to the bus, if an integrated circuit exists on the address the integrated circuit will respond such as with an ACK. In one embodiment the firmware then proceeds to give the integrated circuit new unique addresses.

Approach Using Hardwired Addresses

In one embodiment each integrated circuit has one $I^2C$ address, i.e. each device has its own $I^2C$ address. So in order to address e.g. 16 channels using 4 integrated circuits with 4 channels each, 4 $I^2C$ addresses are required. One example of the addressing is shown below:

| X0 | X1 | X2 | X3 | X4 | A0 | A1 |

X<0:3> are programmed or hardwired individually for each integrated circuit. X4=0 for the transmitter chip n the module and X4=1 for the receiver chip. A<0:1> are programmed or hardwired via the external pins ADR0 and ADR1 respectively. This enables easy programming of up to 16 channels of transmitters and receivers in one module. If more channels are desired clock switching or other means of selection could be applied to address the integrated circuit.

In one embodiment part of the memory map of an integrated circuit (see e.g. FIG. 4) is read only memory and other parts are writable either through the $I^2C$ interface or through internal logic.

In one embodiment the start-up state after power-on is determined by factory defined defaults or a PROM (i.e. a non-volatile memory), if it has been programmed. The setting can subsequently be changed through the $I^2C$ control interface.

In one embodiment, during power-up the RAM load sequence first store default values, second store PROM values and third load through $I^2C$. In one embodiment the information in the RAM comes from either the default registers, the PROM or through the $I^2C$ interface. The RAM holds the settings for the drivers. In one embodiment the RAM is volatile and therefore erased after a power down.

In one embodiment the $I^2C$ interface may be used to program the integrated circuit and to read out status of monitors and fault conditions.

Mechanical Specifications and Pin Assignments

As mentioned above, the integrated circuits may be placed in parallel to modularly increase the number of channels. The following is an example of a mechanical specification for a 4-channel integrated circuit adhering to 250 µm pitch in the optoelectronic devices in this case VCSELs and photodiodes according to FIG. 5 or 7. The integrated circuits are in this example arranged with pads for flip-chip assembly. However, the present invention is not necessarily limited to flip-chip mounted chips and may, for example, also be applied in chips intended for wire bonding or ordinary SMD assembly.

The pads in this example correspond to the addressing using hardwired addresses described above.

As will be clear to a skilled person the specifications are merely exemplary and may be altered while having due considerations to the spirit of the invention as laid out in this document and the claims and items below.

Common

TABLE 1

Common mechanical specifications

| Symbol | Characteristic | Min | Typ | Max | Unit |
|---|---|---|---|---|---|
| $X_{DIE}$ | Die width | | 900 | | µm |
| $Y_{DIE}$ | Die length | | 1000 | | µm |
| $Z_{DIE}$ | Die thickness | | TBD | | µm |
| $\Delta X_{PAD}$ | Pad pitch | 100 | | | µm |
| $\Delta X_{Chanal}$ | Channel pitch | 225 | | | µm |

TABLE 2

Pad specifications

| Symbol | Characteristic | Conditions | Min | Typ | Max | Unit |
|---|---|---|---|---|---|---|
| $X_{PAD}$ | Pad opening | | | 60 | | µm |

Floorplan for Transmitter/Driver (FIG. 5)

The VD (=VCSEL Driver) IC (Integrated circuit) has a total width of 900 um i.e. in this case 100 um less than the width of 4 VCSEL array with pitch of 250 µm. As described above this layout has the option of connecting 2 or 4 channels VCSEL drivers in parallel to an 8×1 VCSEL array and effectively obtain an 8 channel VCSEL driver. This approach can further be extended to 12 and 16 channel VCSEL drivers or higher as well as it may be implemented with a different channel number in the integrated circuits.

Pad List for the Transmitter (FIG. 5)

TABLE 3

I/O assignments for the circuit of FIG. 5

| Name | Pad coordinates | Type | Description |
|---|---|---|---|
| GND | TBD | Power | Ground. Negative voltage supply and substrate bias |
| GND2 | TBD | Power | Digital IO ground. Negative supply and substrate bias. |
| VDD | TBD | Power | Positive voltage supply |
| $V_{DD,\ VCSEL}$ | TBD | Power | Positive voltage supply for output driver |
| DI1, DIN1 | TBD, TBD | Analogue input | Differential data input (driver 1) |
| DI2, DIN2 | TBD, TBD | Analogue input | Differential data input (driver 2) |
| DI3, DIN3 | TBD, TBD | Analogue input | Differential data input (driver 3) |
| DI4, DIN4 | TBD, TBD | Analogue input | Differential data input (driver 4) |
| DO1, GND | TBD, | Analogue output | Data output (driver 1), DO1 connected to VCSEL anode GND connected to VCSEL cathode |
| DO2, GND | TBD, | Analogue output | Data output (driver 2), DO2 connected to VCSEL anode GND connected to VCSEL cathode |
| DO3, GND | TBD, | Analogue output | Data output (driver 3), DO3 connected to VCSEL anode, GND connected to VCSEL cathode |
| DO4, GND | TBD, | Analogue output | Data output (driver 4), DO4 connected to VCSEL anode, GND connected to VCSEL cathode |
| ANA | TBD | Analogue output | |
| SCL | TBD | Digital Input | Clock signal for I²C interface |
| SDA | TBD | Digital Input/ Output | Serial data (I²C) input/output |
| HV | TBD | HV Input | PROM programming |
| AD0 | TBD | Digital Input | I2C adress bit |
| AD1 | TBD | Digital Input | I2C adress bit |

Pad List for the Receiver (FIG. 7)

Floor plan of the receiver integrated circuit of FIG. 7. The outer boundaries with dimensions 1000 μm by 900 μm define the circumscribed rectangle and device side is the right hand side of the rectangle.

Pin List for the Receiver

TABLE 4

Receiver I/O assignments for the circuit of FIG. 7

| Name | Pad coordinates | Type | Description |
|---|---|---|---|
| GND | TBD | Power | Ground. Negative voltage supply and substrate bias |
| GND2 | TBD | Power | Digital IO ground. Negative supply and substrate bias. |
| VDD | TBD | Power | Positive voltage supply |
| VDD2 | TBD | Power | Positive voltage supply for output driver |
| DO1, DON1 | TBD, TBD | Analogue output | Differential data input (driver 1) |
| DO2, DON2 | TBD, TBD | Analogue output | Differential data input (driver 2) |
| DO3, DON3 | TBD, TBD | Analogue output | Differential data input (driver 3) |
| DO4, DON4 | TBD, TBD | Analogue output | Differential data input (driver 4) |
| DI1, VB1 | TBD, | Analogue input | Data input (receiver 1), DI1 connected to Pin Anode, VB1 connected to Pin Cathode |
| DI2, VB2 | TBD, | Analogue input | Data input (receiver 1), DM connected to Pin Anode, VB1 connected to Pin Cathode |
| DI3, VB3 | TBD, | Analogue input | Data input (receiver 1), DM connected to Pin Anode, VB1 connected to Pin Cathode |
| DI4, VB4 | TBD, | Analogue input | Data input (receiver 1), DM connected to Pin Anode, VB1 connected to Pin Cathode |
| ANA | TBD | Analogue output | |
| SCL | TBD | Digital Input | Clock signal for I²C interface |
| SDA | TBD | Digital Input/ Output | Serial data (I²C) input/output |
| HV | TBD | HV Input | PROM programming |
| AD0 | TBD | Digital Input | I2C adress bit |
| AD1 | TBD | Digital Input | I2C adress bit |

The invention is further defined by the following list of items:

1. A chip comprising M≥2 integrated circuits each surrounded by a guard ring, each integrated circuit comprising N≥1 channel-circuits each arranged to provide or receive a high speed data stream from or to an optoelectronic devices and for each of said N channel circuits the chip comprises
   a. at least one data pad for sending or receiving data from said optoelectronic device via said channel circuit,
   b. at least one connecting pad for connecting said channel circuit to said the respective optoelectronic device, said circuit being arranged on a substrate and said guard ring defining a circumscribed rectangle having at least one device side substantially along which said connecting pads are arranged and said optoelectronic devices are arranged in an array with a pitch Λ wherein the length of said device side is less than or equal to N·Λ.
2. The chip of item 1 wherein two or more of said N optoelectronic devices are substantially identical.
3. The chip of any of the preceding items wherein said circuit further comprises a digital interface at least arranged to receive management data for adjusting one or more of said N channel-circuits.
4. The chip of any of the preceding items wherein said data pads are arranged substantially along the opposing edge to the device side of said circumscribed rectangle.
5. The chip of any of the preceding items wherein said pitch Λ is less than or equal to 500 μm, such as less than or equal to 300 μm, such as less than or equal to 250 μm, such as less than or equal to 200 μm, such as less than or equal to 150 μm, such as less than or equal to 125 μm, such as less than or equal to 100 μm, such as less than or equal to 75 μm, such as less than or equal to 50 μm.
6. The chip of any of the preceding items wherein N is more than or equal to 2, such as more than or equal to 3, such as more than or equal to 4, such as more than or equal to 5, such as more than or equal to 6, such as more than or equal to 7, such as more than or equal to 8, such as more than or equal to 9, such as more than or equal to 10, such as more than or equal to 11, such as more than or equal to 12, such as more than or equal to 13, such as more than or equal to 14, such as more than or equal to 15, such as more than or equal to 16.

7. The chip of any of the preceding items wherein the chip comprises M≥2 integrated circuits, such as M≥3, such as M≥4, such as M≥5, such as M≥6, such as M≥7, such as M≥8, such as M≥9, such as M≥10, such as M≥11, such as M≥12, such as M≥13, such as M≥14, such as M≥15, such as M≥16.

8. The chip of item 7 wherein said circumscribed rectangles are spaced apart a distance d.

9. The chip of item 8 wherein the length of said device side is substantially equal to N·Λ−d.

10. The chip of item 8 or 9 wherein the spacing d is suitable for allowing a cut between said circumscribed rectangles.

The invention claimed is:

1. An optoelectronic system for optical communication of high-speed data comprising:
   a. an array of optoelectronic devices arranged in an array with a pitch Λ,
   b. a physically dividable chip electrically connected to the optoelectronic devices of said array, said chip comprising M2 individual integrated circuits, said chip being physically dividable into subsections, each of the subsections comprising at least one of said M individual integrated circuits, each of the individual integrated circuits comprising:
      i. one or more, N, channel-circuits each arranged to provide a high speed data stream to one of the optoelectronic devices in the array via at least one connection pad or arranged to receive a high speed data stream from one of the optoelectronic device in the array via at least one connection pad, and
      ii. a digital interface arranged to receive management data for adjusting one or more of said channel-circuits;
   wherein the dividable chip is physically dividable into subsections without impairing the functionality of the individual integrated circuits.

2. The optoelectronic system of claim 1 wherein said dividable chip comprises a seal ring surrounding each individual integrated circuit and said connection pads are arranged inside said seal ring.

3. The optoelectronic system of claim 1 wherein said individual integrated circuits are configurable via a common interface.

4. The optoelectronic system of claim 1 wherein N is more than or equal to 2.

5. The optoelectronic system of claim 1 wherein said dividable chip is arranged so the length of the chip measured in parallel to said array is less than 1000 μm longer than said array.

6. The optoelectronic system of claim 1 wherein each individual integrated circuit defines a circumscribed rectangle on said chip having at least one device side substantially along which said connecting pads are arranged and the length of said device side is less than or equal to N·Λ+500 μm.

7. The optoelectronic system of claim 1 wherein each individual integrated circuit defines a circumscribed rectangle on said chip having at least one device side substantially along which said connecting pads are arranged and the length of said device side is less than or equal to N·Λ.

8. The optoelectronic system of claim 1 wherein two or more of said M individual integrated circuits are substantially identical.

9. The optoelectronic system of claim 1 where each individual integrated circuit defines a circumscribed rectangle on said chip having at least one device side substantially along which said connecting pads wherein said circumscribed rectangles are spaced apart a distance d and the length of said device side is substantially equal to N·Λ−d.

10. The optoelectronic system of claim 1 where each individual integrated circuit defines a circumscribed rectangle on said chip having at least one device side substantially along which said connecting pads wherein said circumscribed rectangles are spaced apart a distance d and the spacing d is suitable for allowing a cut between said circumscribed rectangles.

11. The optoelectronic system of claim 1 wherein said system is at least a part of a transmitter driver module, receiver module or a transceiver module.

12. The optoelectronic system of claim 1 wherein the dividable chip is physically dividable into subsections by cutting, sawing, scribing, or breaking.

13. A chip comprising M≥2 individual integrated circuits, each of the individual integrated circuits comprising
   a. one or more, N, channel-circuits each arranged to provide a high speed data stream to or receive a high speed data stream from an optoelectronic device,
   b. for each of said one or more channel circuits at least one data pad for sending data to or receiving data from said optoelectronic device via said channel circuit,
   c. for each of said one or more channel circuits at least one connecting pad for connecting said channel circuit to said the respective optoelectronic device, and
   d. digital interface arranged to allow adjustment, such as digital control of operating parameters of said channel circuits, via an input to said digital interface,
   wherein said chip is physically dividable so that a spacing d between the M individual integrated circuits allows the chip to be physically divided via a cut into subsections each comprising at least one of said M individual integrated circuits and said at least one of said M individual integrated circuits will be operable after division; and
   wherein the chip is physically dividable into subsections without impairing the functionality of the individual integrated circuits.

14. The chip of claim 13 wherein said chip comprises a seal ring surrounding each individual integrated circuit.

15. The chip of claim 13 wherein said data pad(s) and connecting pad(s) are placed within said seal ring.

16. The chip of claim 13 wherein each individual integrated circuit defines a circumscribed rectangle on said chip having at least one device side substantially along which said connecting pads are arranged and the length of said device side is equal to the number of channel circuits in said individual integrated circuit multiplied by 400 μm or less.

17. The chip of claim 13 wherein each individual integrated circuit defines a circumscribed rectangle on said chip having at least one device side substantially along which said connecting pads are arranged and the length of said device side is equal to the number of channel circuits in said individual integrated circuit multiplied by 250 μm or less.

18. The chip of claim 13 wherein N is more than or equal to 2.

19. The chip of claim 13 wherein at least two of said individual-integrated circuits is a light source driver circuit with N channels for driving N light sources.

20. The chip of claim 13 wherein at least two of said individual-integrated circuits are receiver circuits with N channels for receiving the received photocurrent from N photo detectors.

21. The chip of claim 13 wherein at least two of said individual-integrated circuits are transceiver circuits with N–X channels for receiving the received photocurrent from N–X photo detectors and X channels for driving X light sources.

22. The chip of claim 13 wherein at least one of said individual-integrated circuits is a receiver circuit comprising Y channels for receiving the received photocurrent from Y photo detectors and at least one of said individual integrated circuits is a light source driver circuit with N channels for driving N light sources.

23. A method of producing a chip according to claim 13 comprising:
   a. forming a number of said individual integrated circuits on a wafer, each individual integrated circuit comprising N channel-circuits, each having a circumscribed rectangle spaced apart at least by a distance d,
   b. cutting from said wafer a chip comprising two or more of said individual integrated circuits and thereby obtaining a chip having the combined set of channels from each individual integrated circuit.

24. The method of claim 23 wherein said integrated circuits on said wafer are substantially identical.

25. The chip of claim 13 wherein the dividable chip is physically dividable into subsections by cutting, sawing, scribing, or breaking.

* * * * *